(12) United States Patent
Tsutsumi et al.

(10) Patent No.: US 10,193,559 B2
(45) Date of Patent: Jan. 29, 2019

(54) CIRCUIT DEVICE, PHYSICAL QUANTITY MEASUREMENT DEVICE, ELECTRONIC APPARATUS, AND VEHICLE

(71) Applicant: Seiko Epson Corporation, Tokyo (JP)

(72) Inventors: Akio Tsutsumi, Chino (JP); Katsuhiko Maki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/712,735

(22) Filed: Sep. 22, 2017

(65) Prior Publication Data

US 2018/0091159 A1   Mar. 29, 2018

(30) Foreign Application Priority Data

Sep. 27, 2016   (JP) .................................. 2016-187862

(51) Int. Cl.
   *H03K 3/13*   (2006.01)
   *H03L 7/081*   (2006.01)
   *H03K 5/135*   (2006.01)

(52) U.S. Cl.
   CPC ........... *H03L 7/0812* (2013.01); *H03K 5/135* (2013.01)

(58) Field of Classification Search
   CPC combination set(s) only.
   See application file for complete search history.

(56) References Cited

U.S. PATENT DOCUMENTS

| 7,304,510 | B2 | 12/2007 | Matsuta |
| 7,486,119 | B2* | 2/2009 | Lee .......................... G11C 7/22 327/149 |
| 7,830,191 | B2 | 11/2010 | Kojima et al. |
| 8,462,840 | B2 | 6/2013 | Chen et al. |
| 8,552,776 | B2* | 10/2013 | Kwak ................... H03L 7/0816 327/161 |
| 9,068,896 | B2 | 6/2015 | Yun et al. |
| 2003/0076181 | A1 | 4/2003 | Tabatabaei et al. |
| 2010/0182186 | A1 | 7/2010 | Lin et al. |
| 2011/0169673 | A1 | 7/2011 | Henzler |
| 2011/0304361 | A1 | 12/2011 | Henzler et al. |
| 2014/0361840 | A1 | 12/2014 | Liu et al. |
| 2015/0145572 | A1 | 5/2015 | Sato |
| 2016/0103423 | A1 | 4/2016 | Chang et al. |
| 2018/0088160 | A1 | 3/2018 | Maki et al. |

(Continued)

FOREIGN PATENT DOCUMENTS

| JP | 64-079687 A | 3/1989 |
| JP | 05-087954 A | 4/1993 |

(Continued)

*Primary Examiner* — An Luu
(74) *Attorney, Agent, or Firm* — Harness, Dickey & Pierce, P.L.C.

(57) ABSTRACT

A circuit device includes a DLL circuit and an adjustment circuit. The DLL circuit has a plurality of delay elements, and a first clock signal generated using a first resonator and having a first clock frequency is input to the DLL circuit. Delayed clock signals from the delay elements of the DLL circuit, and a second clock signal generated using a second resonator and having a second clock frequency lower than the first clock frequency are input to the adjustment circuit, and the adjustment circuit adjusts delay amounts of the delay elements of the DLL circuit using a frequency difference between the first clock frequency and the second clock frequency.

20 Claims, 17 Drawing Sheets

(56) References Cited

U.S. PATENT DOCUMENTS

2018/0088536 A1   3/2018   Kurashina et al.
2018/0091158 A1   3/2018   Sudo et al.

FOREIGN PATENT DOCUMENTS

| JP | 2007-110370 A | 4/2007 |
| JP | 2009-246484 A | 10/2009 |
| JP | 2010-119077 A | 5/2010 |

* cited by examiner

CIRCUIT DEVICE, PHYSICAL QUANTITY MEASUREMENT DEVICE, ELECTRONIC APPARATUS, AND VEHICLE

BACKGROUND

1. Technical Field

The present invention relates to a circuit device, a physical quantity measurement device, an electronic apparatus, a vehicle, and so on.

2. Related Art

In the past, there has been known a DLL circuit for dividing one cycle of a clock signal to generate a multiphase clock signal. In the DLL circuit, the clock signal is input to a delay circuit having a plurality of stages of delay elements, and the delay time of the delay circuit is locked so that the phase difference between the input clock signal and the output clock signal of the delay circuit is equal to one cycle of the clock signal.

Further, in the past, there has been known a circuit device having a time-to-digital conversion circuit. The time-to-digital conversion circuit converts time into a digital value. As related art examples of a circuit device having such a time-to-digital conversion circuit, there are known related art technologies disclosed in, for example, JP-A-2007-110370 (Document 1), JP-A-2009-246484 (Document 2), and JP-A-2010-119077 (Document 3).

In the related art technologies of Documents 1 through 3, the time-to-digital conversion is realized using a so-called vernier delay circuit. In the vernier delay circuit, the time-to-digital conversion is realized using a delay element as a semiconductor element.

In the DLL circuit described above, it is desirable that the delay time in each of the delay stages is accurate. For example, in the time-to-digital conversion described above, the more accurate the delay time in the delay element is, the higher the accuracy of the time-to-digital conversion can be made.

However, in the DLL circuit of the related art, the delay corresponding to one cycle of the clock signal is adjusted in a lump. Therefore, there is a problem that the delay time in each of the delay stages varies due to a variation (e.g., a process variation, a variation depending on temperature, and a variation depending on the voltage) of the delay elements as semiconductor elements. For example, in the case of attempting to measure a minute period in the time-to-digital conversion, it is necessary to create a minute delay time. However, the influence of the variation becomes significant relatively to the minute delay time, and thus, the conversion becomes inaccurate.

SUMMARY

An advantage of some aspects of the invention is to provide a circuit device, a physical quantity measurement device, an electronic apparatus, a vehicle and so on capable of reducing the variation of the delay time in the delay element in the DLL circuit.

The invention can be implemented as the following forms or embodiments.

An aspect of the invention relates to a circuit device including a delay locked loop (DLL) circuit, which has a plurality of delay elements, and to which a first clock signal generated using a first resonator and having a first clock frequency is input, and an adjustment circuit, to which delayed clock signals from the delay elements of the DLL circuit, and a second clock signal generated using a second resonator and having a second clock frequency lower than the first clock frequency are input, and which adjusts delay amounts of the delay elements of the DLL circuit using a frequency difference between the first clock frequency and the second clock frequency.

According to the aspect of the invention, delay amounts of the delay elements of the DLL circuit are adjusted using a frequency difference between the first clock frequency and the second clock frequency. Thus, it becomes possible to adjust the delay amounts of the delay elements in the DLL circuit with the frequency difference, and it becomes possible to reduce the variation of the delay time in the delay elements due to the variation of the semiconductor process and so on compared to the method of adjusting the delay time of the entire DLL circuit in a lump so as to be equal to one cycle of the clock signal as in the related art.

In the aspect of the invention, the adjustment circuit may adjust the delay amounts of the plurality of delay elements of the DLL circuit using a time difference in transition timing between the first clock signal and the second clock signal.

The time difference in the transition timing between the first clock signal and the second clock signal increases by a time difference corresponding to the frequency difference. According to the aspect of the invention with the configuration described above, by adjusting the delay amounts of the plurality of delay elements using the time difference in the transition timing, it is possible to perform the adjustment of the delay amounts using the frequency difference between the first clock frequency and the second clock frequency.

In the aspect of the invention, the adjustment circuit may adjust the delay amount of the i-th (i is an integer no smaller than 1) delay element of the plurality of delay elements using a transition of a signal level at i-th transition timing of the second clock signal after phase synchronization timing between the first clock signal and the second clock signal.

As described above, the time difference in the transition timing between the first clock signal and the second clock signal increases by a time difference corresponding to the frequency difference. According to the aspect of the invention with the configuration described above, by adjusting the delay amount of the i-th delay element using the transition of the signal level at the i-th transition timing of the second clock signal, it becomes possible to adjust the delay amount in each of the delay elements up to the i-th delay element so as to be the delay amount corresponding to the time difference corresponding to the frequency difference.

In the aspect of the invention, the adjustment circuit may adjust the delay amount of the j-th (j is an integer greater than i) delay element of the plurality of delay elements using a transition of the signal level at j-th transition timing after the i-th transition timing of the second clock signal.

As described above, by adjusting the delay amount using the transition of the signal level not only at the i-th transition timing but also at the j-th transition timing, the number of the delayed clock signals, which are adjusted in the delay time by the feedback out of the plurality of delayed clock signals, increases, and thus, it is possible to obtain more accurate delayed clock signals.

In the aspect of the invention, in a case of defining a time difference corresponding to the frequency difference as Δt, the adjustment circuit may adjust the delay amount due to the first through k-th (k is an integer no smaller than 1) delay elements of the plurality of delay elements to a delay amount corresponding to k×Δt.

In the DLL circuit of the related art, the delay amount in a plurality of delay elements is adjusted to be one cycle of the clock signal as a whole. However, according to the aspect of the invention with the configuration described above, the delay amount of the first through k-th delay elements out of the plurality of delay elements is adjusted to the delay amount corresponding to k×Δt. Thus, the influence of the variation in the semiconductor process and so on on the delay amount due to the first through k-th delay elements can be reduced.

In the aspect of the invention, the first clock signal may be input to the DLL circuit, and the DLL circuit may output a plurality of delay clock signals generated by delaying the first clock signal with the plurality of delay elements, and the adjustment circuit may perform phase comparison between the delayed clock signals and the second clock signal, and adjust the delay amounts of the delay elements of the DLL circuit based on a result of the phase comparison.

According to the aspect of the invention with the configuration described above, the phase comparison is performed between the first clock signal (a plurality of delayed clock signals) delayed by the plurality of delay elements and the second clock signal, and then the delay amounts of the delay elements are adjusted based on the result of the phase comparison. By performing the adjustment based on such phase comparison, it is possible to realize the adjustment of the delay amount of the delay element using the frequency difference between the first clock frequency and the second clock frequency.

In the aspect of the invention, in a case of assuming the number of the delay elements of the DLL circuit as n (n is an integer no smaller than 3), the adjustment circuit may adjust the delay amounts of m (m is an integer no smaller than 1 and no greater than n) delay elements.

As described above, in the present embodiment, it is possible to adjust the delay amounts of an arbitrary number (m) of delay elements out of the plurality of delay elements in the DLL circuit. The more the number of delay elements adjusted in the delay amount is increased, the more difficult it becomes to be affected by the variation due to the semiconductor process and so on, and thus, the accuracy of the delay time of the delayed clock signals can be increased. On the other hand, the more the number of the delay elements adjusted in the delay amount is decreased, the more the circuit scale of the adjustment circuit can be reduced.

In the aspect of the invention, the adjustment circuit may adjust at least one of a capacitance value of a variable capacitor provided corresponding to the delay element, and a current value of a variable current source provided corresponding to the delay element.

As described above, by adjusting at least one of a capacitance value of the variable capacitor provided corresponding to the delay element, and a current value of the variable current source provided corresponding to the delay element, it becomes possible to adjust the delay amount of the delay element.

In the aspect of the invention, the circuit device may further include a phase comparison circuit, a first signal is generated based on the first clock signal, and the phase comparison circuit performs phase comparison between the second signal and the plurality of delayed clock signals obtained by delaying the first clock with the DLL circuit.

As described above, by performing the phase comparison between the second signal and the plurality of delay clock signals obtained by delaying the first clock signal with the DLL circuit, it becomes possible to perform the time-to-digital conversion on the time difference between the first signal generated based on the first clock signal and the second signal. According to the aspect of the invention with the configuration described above, since the delay amounts of the delay elements of the DLL circuit are adjusted using a frequency difference between the first clock frequency and the second clock frequency, it is possible to realize the high-performance time-to-digital conversion.

In the aspect of the invention, the circuit device may further include a delay circuit as a replica circuit of the DLL circuit, and a phase comparison circuit, the first signal may be input to the delay circuit, and the delay circuit may delay the first signal to output a plurality of delayed signals, and the phase comparison circuit may perform phase comparison between the second signal and the plurality of delayed signals from the delay circuit.

As described above, by performing the phase comparison between the plurality of delayed signals obtained by delaying the first signal with the delay circuit as the replica circuit of the DLL circuit, and the second signal, it becomes possible to perform the time-to-digital conversion on the time difference between the first signal and the second signal. According to the aspect of the invention with the configuration described above, since the delay amounts of the delay elements of the DLL circuit are adjusted using a frequency difference between the first clock frequency and the second clock frequency, and the first signal is delayed by the delay circuit as the replica circuit thereof, it is possible to realize the high-performance time-to-digital conversion.

In the aspect of the invention, the circuit device may further include a selector adapted to input either of the first clock signal and the first signal to the DLL circuit, and a phase comparison circuit, the selector may select the first clock signal in a first period, and select the first signal in a second period, and the phase comparison circuit may perform phase comparison between the plurality of delayed clock signals from the DLL circuit in the second period and the second signal.

As described above, by performing the phase comparison between the plurality of delayed clock signals obtained by delaying the first signal with the DLL circuit in the second period, and the second signal, it becomes possible to perform the time-to-digital conversion on the time difference between the first signal and the second signal. According to the aspect of the invention with the configuration described above, since the delay amounts of the delay elements of the DLL circuit are adjusted using a frequency difference between the first clock frequency and the second clock frequency, it is possible to realize the high-performance time-to-digital conversion.

Another aspect of the invention relates to a physical quantity measurement device including any one of the circuit devices described above, the first resonator adapted to generate the first clock signal, and the second resonator adapted to generate the second clock signal.

Still another aspect of the invention relates to an electronic apparatus including any one of the circuit devices described above.

Still another aspect of the invention relates to a vehicle including any one of the circuit devices described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail. It should be noted that the embodiment described hereinafter does not unreasonably limit the content of the invention as set forth in the appended claims, and all of the constituents described in the embodiment are not necessarily essential as the elements for solving the problems of the invention.

1. Circuit Device

Figure 1:
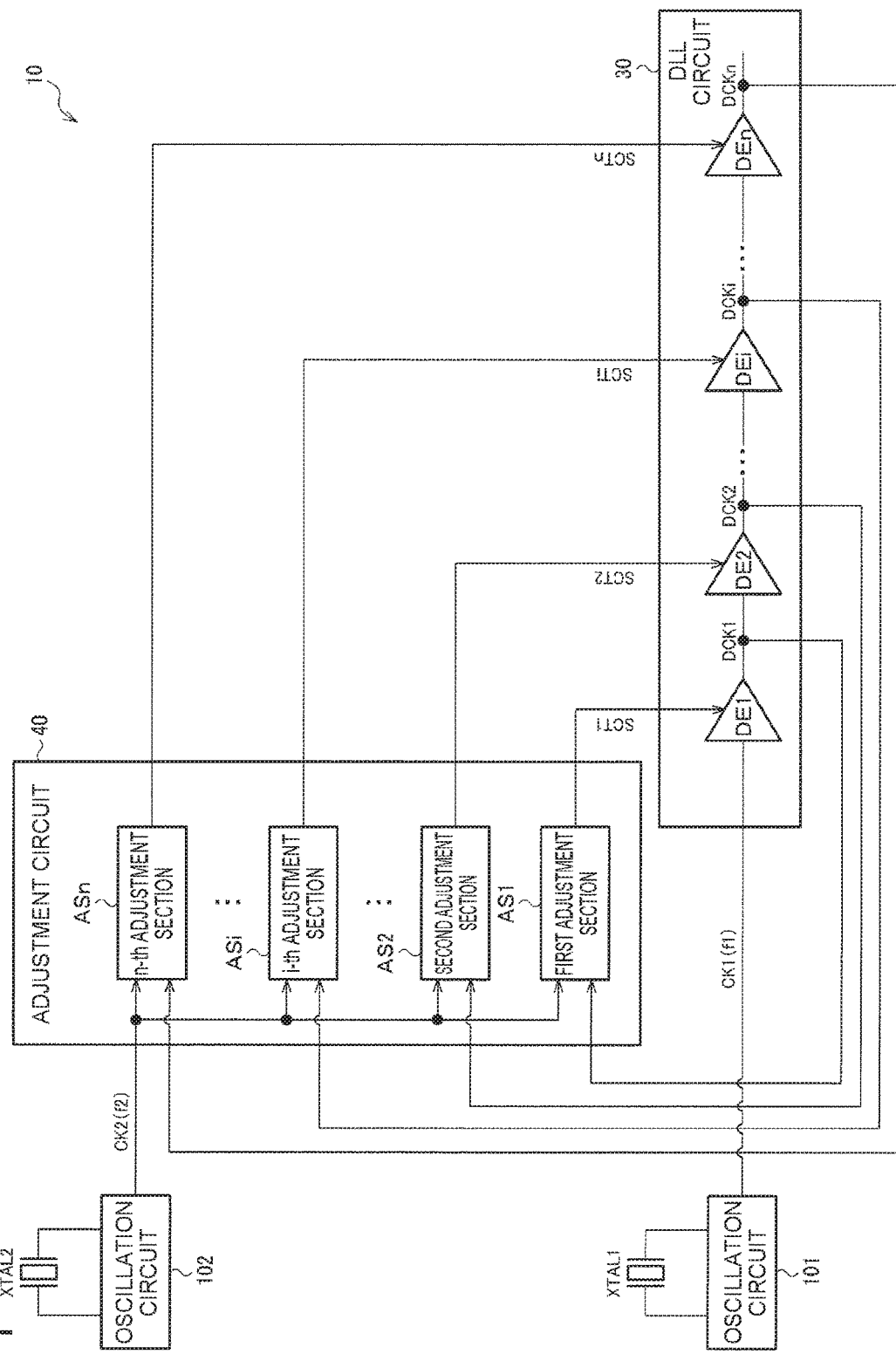
FIG. 1 is a diagram showing a configuration example of a circuit device according to an embodiment of the invention.

FIG. 1 shows a configuration example of a circuit device 10 according to the present embodiment. The circuit device 10 includes a DLL circuit 30 (DLL: Delay Locked Loop), an adjustment circuit 40, a first oscillation circuit 101, and a second oscillation circuit 102. The circuit device 10 is realized by, for example, an integrated circuit device (IC). It should be noted that the configuration of the circuit device 10 is not limited to the configuration shown in FIG. 1, but a variety of practical modifications such as elimination of some of the constituents (e.g., the oscillation circuits 101, 102) or addition of other constituents are possible.

The DLL circuit 30 has a plurality of delay elements. A first clock signal CK1 with a first clock frequency f1 generated using a first resonator XTAL1 is input to the DLL circuit 30.

Specifically, the plurality of delay elements correspond to first through n-th delay elements DE1 through DEn. The reference symbol n denotes an integer equal to or greater than 3. The clock signal CK1 is input to the first delay element DE1, and the first through n-th delay elements DE1 through DEn sequentially delay the clock signal CK1 to output first through n-th delayed clock signals DCK1 through DCKn.

To the adjustment circuit 40, there are input the delayed clock signals from the delay elements of the DLL circuit 30, and a second clock signal CK2 with a second clock frequency f2 generated using a second resonator XTAL2. The second clock frequency f2 is lower than the first clock frequency f1. The adjustment circuit 40 adjusts the delay amounts of the delay elements of the DLL circuit 30 using the frequency difference |f1−f2| between the first clock frequency f1 and the second clock frequency f2.

Therefore, to the adjustment circuit 40, there is input at least one delayed clock signal as the delayed clock signal from the delay element out of the delayed clock signals DCK1 through DCKn. It should be noted that although FIG. 1 shows the case in which all of the delayed clock signals DCK1 through DCKn are input to the adjustment circuit 40, this is not a limitation, but it is sufficient that any one or plurality of delayed clock signals out of the delayed clock signals DCK1 through DCKn is input to the adjustment circuit 40. For example, in the case in which the i-th delayed clock signal DCKi is input to the adjustment circuit 40, the adjustment circuit 40 adjusts the delay amounts of the delay elements based on the delayed clock signal DCKi and the clock signal CK2. For example, the adjustment circuit 40 adjusts the delay amount of at least one of the delay elements DE1 through DEi to thereby adjust the delay time of the delayed clock signal DCKi. The reference symbol i denotes an integer no smaller than 1 and no greater than n.

Figure 2:
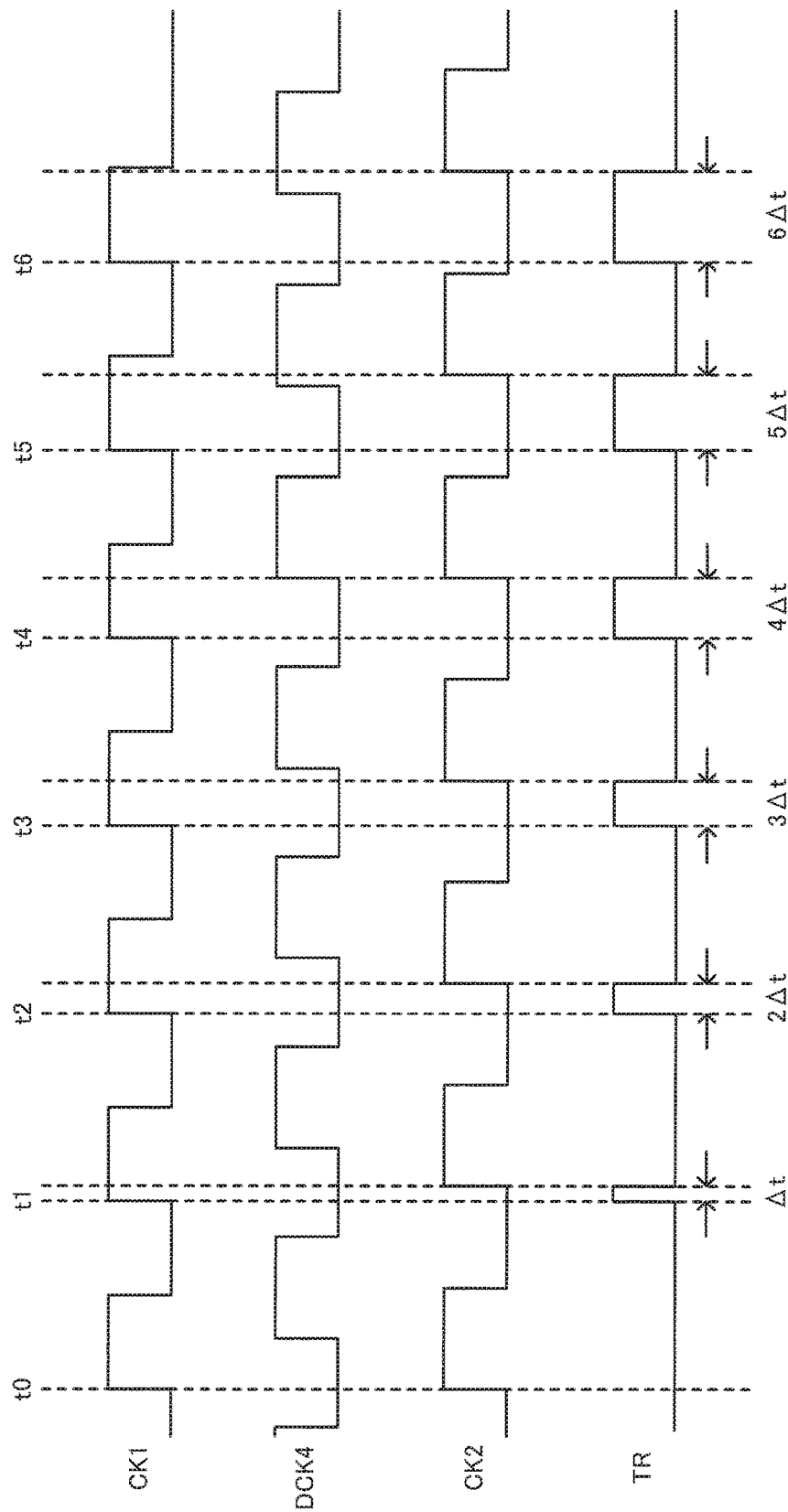
FIG. 2 is a diagram for explaining an adjustment method of a delay amount using a clock frequency difference.

FIG. 2 is a diagram for explaining an adjustment method of a delay amount using a clock frequency difference. At t0, the clock signals CK1, CK2 coincide with each other in the transition timing (the timing at which the logic level of the signal changes, the phase). Subsequently, at t1, t2, t3, . . . , an inter-clock time difference TR (phase difference), which is a time difference in the transition timing between the clock signals CK1, CK2, increases monotonically like Δt, 2Δt, 3Δt, . . . . In FIG. 2, the inter-clock time difference is represented by a pulse signal with a width of TR.

Further, in the adjustment of the delay amounts of the present embodiment, there is used, for example, a plurality of resonators to adjust the delay amounts of the delayed clock signals using the clock frequency difference. Specifically, in the case of defining the clock frequencies of the clock signals CK1, CK2 respectively as f1, f2, the circuit device 10 adjusts the delay time of the delayed clock signals so that the delay time in the delay element in each stage becomes the delay time corresponding to the frequency difference |f1−f2| between the clock frequencies f1, f2. For example, as shown in FIG. 2, the circuit device 10 adjusts the delay time of the delayed clock signals using the principles of a vernier caliper.

By adopting this process, it becomes possible to adjust the delay amounts of the delay elements of the DLL circuit 30 using the frequency difference |f1−f2| between the clock frequencies f1, f2. In other words, it becomes possible to adjust the delay amounts of the delay elements in the DLL circuit using the frequency difference |f1−f2| instead of adjusting the total delay time in a lump so as to be equal to one cycle of the clock signal as in the DLL circuit of the related art. Thus, it becomes possible to reduce the influence of the variation due to the semiconductor process and so on in the delay elements, and it is possible to make the delay time of each of the phases of the multiphase clock signal (a delayed clock signal) generated by the DLL circuit high in accuracy.

For example, in the case of using the DLL circuit 30 of the present embodiment for the time-to-digital conversion, it becomes possible to set the resolution of the time-to-digital conversion using the frequency difference |f1−f2| between the clock frequencies f1, f2. Further, since the influence of the variation due to the semiconductor process and so on is reduced, an improvement and so on of the performance such as the accuracy or the resolution of the time-to-digital conversion becomes possible.

Specifically, the adjustment circuit 40 adjusts the delay amounts of the plurality of delay elements of the DLL circuit 30 using the time difference in transition timing between the first clock signal CK1 and the second clock signal CK2.

Specifically, since the inter-clock time difference TR, which is the time difference in transition timing between the clock signals CK1, CK2, increases by Δt like Δt, 2Δt, 3Δt, . . . , it becomes possible to adjust the delay amounts using the inter-clock time difference TR so that the delay time in the delay element in each stage becomes Δt. This delay amount Δt can be expressed as follows, and is the delay amount corresponding to the frequency difference |f1−f2|.

$$\Delta t = |1/f1 - 1/f2| = |f1 - f2|/(f1 \times f2)$$

Further, the adjustment circuit 40 adjusts the delay amount of the i-th delay element DEi of the plurality of delay elements using the transition of the signal level at the i-th transition timing (ti+i×Δt) of the second clock signal CK2 after the phase synchronization timing (t0) between the first clock signal CK1 and the second clock signal CK2.

Further, the adjustment circuit 40 adjusts the delay amount of the j-th delay element DEj of the plurality of delay elements using the transition of the signal level at the j-th transition timing (tj+j×Δt) after the i-th transition timing of the second clock signal CK2. The reference symbol j fulfills j>i, and denotes an integer equal to or smaller than n.

Therefore, the adjustment circuit 40 adjusts the delay amount of the delay element DEi based on the phase difference between the i-th transition timing of the second clock signal CK2 and the transition timing of the i-th delayed clock signal DCKi. Specifically, the adjustment is performed so that those transition timings coincide with each other (the phase difference becomes zero). Similarly, the adjustment circuit 40 adjusts the delay amount of the delay element DEj based on the phase difference between the j-th transition timing of the second clock signal CK2 and the transition timing of the j-th delayed clock signal DCKj. Here, the transition of the signal level denotes that the clock signal makes the transition from a first logic level to a second logic level, or the clock signal makes the transition from the second logic level to the first logic level. It should be noted that in FIG. 2, there is illustrated the case of adjusting the delay amount using the transition from the low level to the high level in the clock signal CK2.

By adjusting the delay amounts of the i-th and j-th delay elements DEi, DEj using the transitions of the signal level at the i-th and j-th transition timings of the second clock signal CK2 as described above, it becomes possible to adjust the delay amount using the frequency difference |f1−f2| between the clock frequencies f1, f2. Specifically, since the time difference in transition timing between the clock signals CK1, CK2 increases by Δt at every transition timing, by adjusting the delay amounts of the i-th and j-th delay elements DEi, DEj using the transition of the signal level at the i-th and j-th transition timings, it is possible to perform the adjustment so that the delay amount in each of the delay elements up to the i-th and j-th delay elements DEi, DEj becomes Δt. Further, by performing the adjustment using the transition of the signal level at a plurality of transition timings, the number of delayed clock signals, the delay time of which is adjusted by feedback, out of the plurality of delayed clock signals increases, and thus, the delayed clock signals, which are more accurate (in which the influence of the variation due to the semiconductor process and so on is reduced), can be obtained.

Here, the phase synchronization timing is the timing at which the transition timings (the phases) of the clock signals CK1, CK2 coincide (or roughly coincide) with each other. For example, in the case in which the clock signals CK1, CK2 are synchronized with each other by the synchronizing circuit (the synchronizing circuit 110 shown in FIG. 9) or the like, the synchronization timing (the timing for the phase comparator to perform the phase comparison) of the synchronizing circuit or the like corresponds to the phase synchronization timing described above. It should be noted that it is not required for the clock signals CK1, CK2 to be synchronized with each other by the synchronizing circuit. In this case, the phase synchronization timing is the timing at which, for example, the phase comparator compares the phases of the clock signals CK1, CK2 with each other, and determines that the phases coincide with each other (the anteroposterior relationship in phase between the clock signals CK1, CK2 is reversed).

Further, in the case of defining the time difference corresponding to the frequency difference |f1−f2| as Δt, the adjustment circuit 40 adjusts the delay amount due to the first through k-th delay elements DE1 through DEk of the plurality of delay elements to the delay amount corresponding to k×Δt. It should be noted that the reference symbol k denotes an integer no smaller than 1 and no greater than n. Specifically, the adjustment circuit 40 adjusts the delay amount due to the first delay element DE1 to the delay amount corresponding to 1×Δt, or in the case in which k is equal to or greater than 2, the adjustment circuit 40 adjusts the delay amount due to the first through k-th delay elements DE1 through DEk to the delay amount corresponding to k×Δt.

For example, FIG. 2 shows the case of k=4. In this example, the adjustment circuit 40 adjusts the delay amount so that the transition timing of the delayed clock signal DCK4 coincides with the fourth transition timing of the clock signal CK2. Since the delayed clock signal DCK4 is obtained by delaying the clock signal CK1 with the delay elements DE1 through DE4, the delay time of the delayed clock signal DCK4 with respect to the clock signal CK1 is 4Δt. In such a manner, the delay amount due to the delay elements DE1 through DE4 is adjusted to the delay amount corresponding to 4Δt. It should be noted that although the description is presented here using the case of k=4 as an example, k is not limited to 4.

In the past, the delay amount due to the delay elements DE1 through DEn is just adjusted to one cycle of the clock signal, and therefore, the delay amount due to the delay elements DE1 through DEk located in between cannot be adjusted. In this regard, in the present embodiment, it is possible to adjust the delay amount due to the delay elements DE1 through DEk located in between. Further, the delay amount is not necessarily limited to one cycle of the clock signal, but it is possible to lock the DLL circuit with a delay amount (k×Δt) other than one cycle of the clock signal using the difference in frequency |f1−f2| between the two clock signals CK1, CK2.

More specifically, as shown in FIG. 1, the adjustment circuit 40 includes first through n-th adjustment sections AS1 through ASn.

The i-th adjustment section ASi compares the transition timing of the delayed clock signal DCKi and the i-th transition timing of the clock signal CK2 with each other, and outputs a control signal SCTi based on the comparison result. The control signal SCTi is a signal for controlling the delay amount of the delay element DEi. In the case in which the transition timing of the delayed clock signal DCKi leads the i-th transition timing of the clock signal CK2, the delay amount of the delay element DEi is increased. In contrast, in the case in which the transition timing of the delayed clock signal DCKi lags the i-th transition timing of the clock signal CK2, the delay amount of the delay element DEi is decreased.

It should be noted that in the case of performing feedback based only on some of the delayed clock signals DCK1 through DCKn, it is sufficient to dispose only the adjustment sections corresponding to those delayed clock signals. For example, in the case of inputting only the delayed clock signals DCKp, DCKn (the reference symbol p is an integer no smaller than one and no greater than n−1, and fulfills p≠q) to the adjustment circuit 40, it is sufficient for the adjustment circuit 40 to include only the adjustment sections ASp, ASn. In this case, it is sufficient to input the control signal SCTp to the delay elements DE1 through DEp, and input the control signal SCTn to the delay elements DEp+1 through DEn.

In the present embodiment described hereinabove, the first clock signal CK1 is input to the DLL circuit 30, and the DLL circuit 30 outputs the plurality of delayed clock signals (DCK1 through DCKn) generated by delaying the first clock signal CK1 with the plurality of delay elements (DE1 through DEn). Then, the adjustment circuit 40 performs the phase comparison between the delayed clock signal (at least one of the delayed clock signals DCK1 through DCKn) and the second clock signal CK2, and then adjusts the delay amounts of the delay elements of the DLL circuit 30 based on the result of the phase comparison.

According to the present embodiment, since the phase comparison is performed between the clock signal CK1 delayed by the plurality of delay elements and the clock signal CK2, there is realized the adjustment of the delay amounts using the difference in frequency |f1−f2| between the clock signals CK1, CK2 described with reference to FIG. 2. Specifically, since the time difference in transition timing between the clock signals CK1, CK2 increases in such a manner as Δt, 2Δt, 3Δt, . . . , by aligning the phase of the delayed clock signal with the clock signal CK2 as the lagged clock signal, the delay amounts of the signals having passed through the delay elements DE1, DE2, DE3, . . . are obtained as Δt, 2Δt, 3Δt, . . . .

Further, in the present embodiment, the adjustment circuit 40 is a circuit device characterized in that in the case of assuming the number of delay elements in the DLL circuit 30 as n, the delay amounts of the m delay elements are adjusted. The reference symbol m denotes an integer no smaller than 1 and no greater than n. It should be noted that m is desirably equal to or greater than 2.

As described above, in the present embodiment, it is possible to adjust the delay amounts of an arbitrary number (m) of delay elements out of the plurality of delay elements in the DLL circuit 30. The more the number of delay elements adjusted in the delay amount is increased, the more difficult it becomes to be affected by the variation due to the semiconductor process and so on, and thus, the accuracy of the delay time of the delayed clock signals can be increased. On the other hand, the more the number of the delay elements adjusted in the delay amount is decreased, the more the circuit scale of the adjustment circuit 40 can be reduced. Therefore, it is possible to set the number of the delay elements adjusted in the delay amount in accordance with the desired accuracy and the circuit scale. For example, it is also possible to adjust the delay amounts of every predetermined number of delay elements out of the plurality of delay elements.

Incidentally, as described above, in the present embodiment, the clock signals CK1, CK2 are generated using the resonators XTAL1, XTAL2.

Specifically, the oscillation circuits 101, 102 are circuits for oscillating the resonators XTAL1, XTAL2. For example, the oscillation circuit 101 (a first oscillation circuit) oscillates the resonator XTAL1 (a first resonator) to generate the clock signal CK1 with the clock frequency f1. The oscillation circuit 102 (a second oscillation circuit) oscillates the resonator XTAL2 (a second resonator) to generate the clock signal CK2 with the clock frequency f2.

The resonators XTAL1, XTAL2 are each, for example, a piezoelectric resonator. Specifically, the resonators XTAL1, XTAL2 are each, for example, a quartz crystal resonator. The resonators XTAL1, XTAL2 are each a thickness-shear vibration type quartz crystal resonator such as an AT-cut type or an SC-cut type. For example, the resonators XTAL1, XTAL2 each can also be a resonator of a simple-package type (SPXO), an oven type (OCXO) provided with a thermostatic oven, or can also be a resonator of a temperature compensation type (TCXO) not provided with the thermostatic oven. Further, as the resonators XTAL1, XTAL2, it is also possible to adopt a surface acoustic wave (SAW) resonator, an MEMS (micro electromechanical systems) resonator as a resonator made of silicon, and so on.

By using the clock signal generated by the resonator as described above, it is possible to obtain the oscillation frequency high in accuracy compared to the method not using the resonator, and make the delay amounts of the delay elements high in accuracy. For example, in the case of applying the DLL circuit 30 of the present embodiment to the time-to-digital conversion, the improvement of the accuracy of the time-to-digital conversion can be achieved compared to the method not using the resonator.

2. Delay Elements

A detailed configuration example of the delay elements in the DLL circuit 30 will hereinafter be described. It should be noted that the explanation will hereinafter be presented citing the i-th delay element DEi as an example.

In the DLL circuit 30, there is disposed at least one of a variable capacitor and a variable current source in accordance with the delay element DEi. Further, the adjustment circuit 40 adjusts at least one of the capacitance value of the variable capacitor and the current value of the variable current source.

Specifically, the variable capacitor is a capacitor for making the load capacitance of the delay element DEi variable. The variable current source is a current source for making the current for setting the drive capacity of the delay element DEi variable. The adjustment circuit 40 controls (adjusts) the capacitance value, the current value, or the capacitance value and the current value with the control signal SCTi. Thus, the adjustment of the delay amount (the delay time of the delayed clock signal DCKi) of the delay element DEi is realized.

It should be noted that although there are hereinafter described the case of adjusting the capacitance value of the variable capacitor, and the case of adjusting the current value of the variable current source, it is also possible to adjust both of the capacitance value and the current value by arbitrarily combining these cases with each other.

Figure 3:
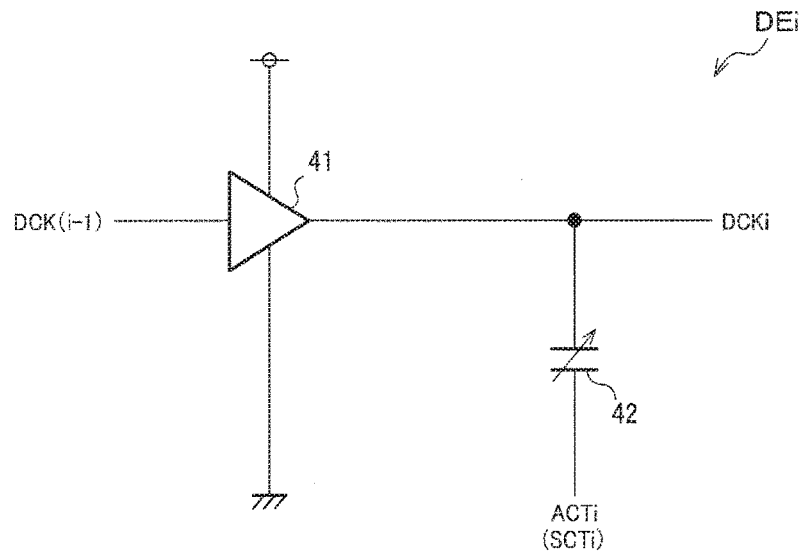
FIG. 3 is a diagram showing a first detailed configuration example of a delay element.

Firstly, the case of adjusting the capacitance value of the variable capacitor will be described. FIG. 3 shows a first detailed configuration example of the delay element DEi. The delay element DEi shown in FIG. 3 includes a buffer circuit 41, and a varactor 42 (a variable capacitance diode).

The buffer circuit 41 buffers the delayed clock signal DCK(i−1), and outputs the delayed clock signal DCKi. The buffer circuit 41 is a circuit for buffering and outputting a signal having the same logic level as the input logic level, and is formed of, for example, two stages of inverters or comparators (amplifier circuits).

One end of the varactor 42 is connected to an output node of the buffer circuit 41, and a control voltage ACTi is input to the other end. In the case in which the adjustment section ASi outputs an analog control signal SCTi, the control voltage ACTi corresponds to the analog control signal SCTi. By the adjustment section ASi varying the control voltage ACTi, the capacitance value of the varactor 42 varies, and thus, the delay time in the buffer circuit 41 varies.

Figure 4:
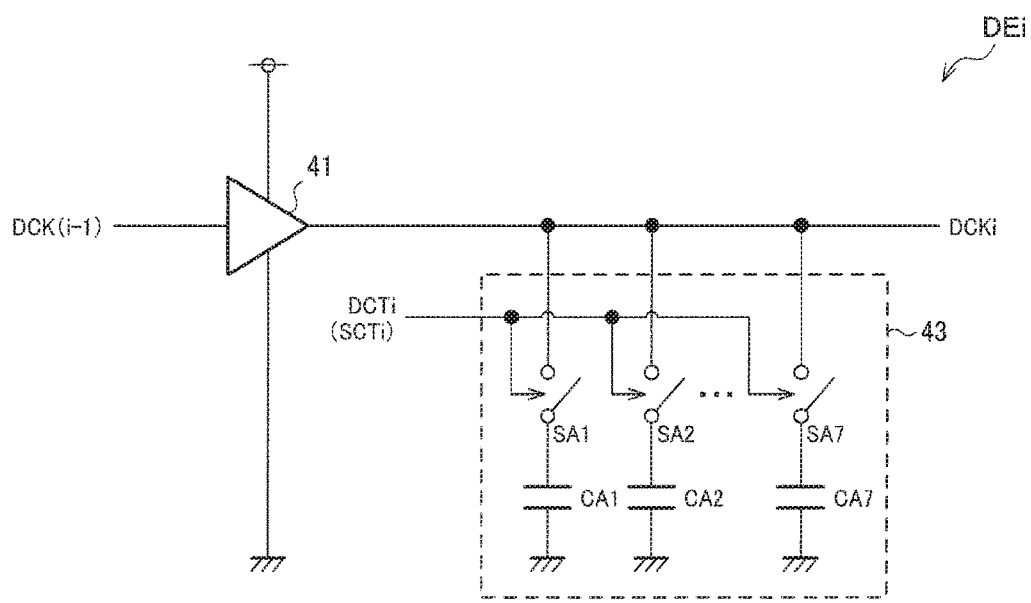
FIG. 4 is a diagram showing a second detailed configuration example of the delay element.

FIG. 4 shows a second detailed configuration example of the delay element DEi. The delay element DEi shown in FIG. 4 includes the buffer circuit 41, and a capacitor circuit 43.

The capacitor circuit 43 includes switches SA1 through SA7, one ends of which are connected to the output node of the buffer circuit 41, and capacitors CA1 through CA7, one ends of which are connected respectively to the other ends of the switches SA1 through SA7. The other ends of the capacitors CA1 through CA7 are connected to, for example, a low potential side power supply node. The switches SA1 through SA7 are each, for example, a transistor. The switches SA1 through SA7 are each controlled by the control data DCTi to be set to the ON state or the OFF state. In the case in which the adjustment section ASi outputs a digital control signal SCTi, the control data DCTi corresponds to the digital control signal SCTi. By the adjustment section ASi changing the control data DCTi, the capacitors to be connected to the output node of the buffer circuit 41 out of the capacitors CA1 through CA7 are changed, and thus the delay time in the buffer circuit 41 varies. It should be noted that the number of the switches and the capacitors provided to the capacitor circuit 43 is not limited to 7.

Figure 5:
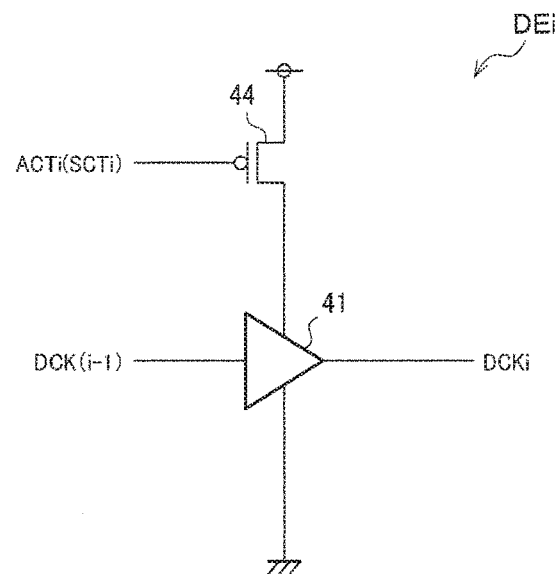
FIG. 5 is a diagram showing a third detailed configuration example of the delay element.

Then, the case of adjusting the current value of the variable current source will be described. FIG. 5 shows a third detailed configuration example of the delay element DEi. The delay element DEi shown in FIG. 5 includes the buffer circuit 41, and a transistor 44.

The transistor 44 is disposed between a high potential side power supply node of the buffer circuit 41 and the high potential side power supply. The transistor 44 is, for example, a P-type transistor (a first conductivity type transistor). The control voltage ACTi is input to the gate of the transistor 44. By the adjustment section ASi varying the control voltage ACTi, the drain current of the transistor 44 varies, and thus, the delay time (the delay time when DCKi makes the transition from the low level to the high level) in the buffer circuit 41 varies. It should be noted that it is also possible to insert the transistor (an N-type transistor (a second conductivity type transistor)) in the low potential side power supply instead of the high potential side power supply. Alternatively, it is also possible to insert the transistors to both of the high potential side power supply and the low potential side power supply.

Figure 6:
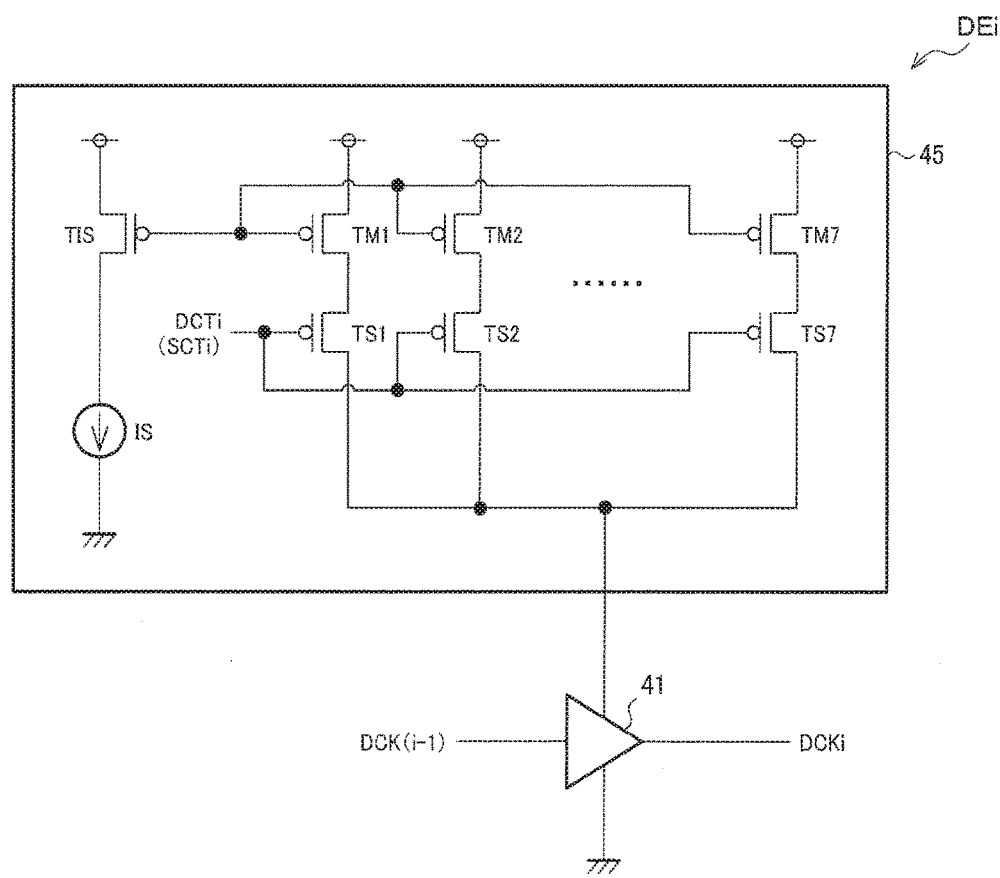
FIG. 6 is a diagram showing a fourth detailed configuration example of the delay element.

FIG. 6 shows a fourth detailed configuration example of the delay element DEi. The delay element DEi shown in FIG. 6 includes the buffer circuit 41, and a current mirror circuit 45.

The current mirror circuit 45 includes a current source IS, a transistor TIS, mirroring transistors TM1 through TM7, and switching transistors TS1 through TS7, and is disposed between the high potential side power supply node of the buffer circuit 41 and the high potential side power supply. The transistors TIS, TM1 through TM7, and TS1 through TS7 are each a P-type transistor (the first conductivity type transistor). The bias current supplied from the current source IS is mirrored by the transistors TM1 through TM7 via the transistor TIS. The transistors TS1 through TS7 are disposed between the transistors TM1 through TM7, and the high potential side power supply node of the buffer circuit 41, respectively, and are each controlled by the control data DCTi to be set to the ON state or the OFF state. By the adjustment section ASi changing the control data DCTi, the transistors to be connected to the high potential side power supply node of the buffer circuit 41 out of the transistors TM1 through TM7 are changed, and thus the delay time in the buffer circuit 41 varies. It should be noted that the number of the mirroring transistors and the switching transistors provided to the current mirror circuit 45 is not limited to 7. Further, it is also possible to insert the current mirror circuit to the low potential side power supply instead of the high potential side power supply. Alternatively, it is also possible to insert the current mirror circuits to both of the high potential side power supply and the low potential side power supply.

3. Adjustment Circuit

A detailed configuration example of the adjustment circuit 40 will hereinafter be described. It should be noted that the explanation will hereinafter be presented citing the adjustment section ASi as an example.

Figure 7:
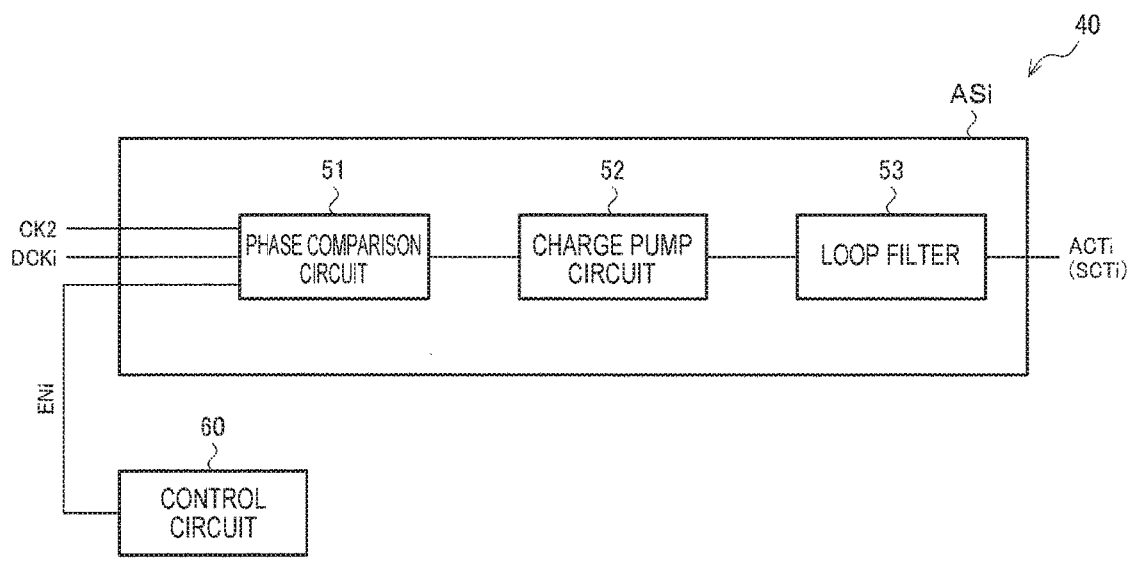
FIG. 7 is a diagram showing a first detailed configuration example of an adjustment circuit.

FIG. 7 shows a first detailed configuration example of the adjustment circuit 40. The adjustment circuit 40 includes the adjustment section ASi and a control circuit 60. The adjustment section ASi includes a phase comparison circuit 51, a charge pump circuit 52, and a loop filter 53. It should be noted that the control circuit 60 can also be disposed outside the adjustment circuit 40.

The control circuit 60 outputs an enable signal ENi which becomes active during the period including the i-th transition timing of the clock signal CK2. For example, the length of the period is one cycle of the clock signal CK2. For example, citing the case of i=4 in FIG. 2 as an example, the timing, at which the clock signal CK2 rises at t4+4Δt, corresponds to the fourth transition timing. For example, the enable signal EN4 becomes active in the period between the falling edges of the clock signal CK2 before and after the fourth transition timing. It should be noted that although the description is presented here using the case of i=4 as an example, i is not limited to 4. Further, although the description is presented citing k=4 as an example when describing the point that the delay amount due to the delay elements DE1 through DEk is adjusted to k×Δt, the example does not mean i=k, and i≠k is also possible.

In the case in which the enable signal ENi is active, the phase comparison circuit 51 compares the phases of the clock signal CK2 and the delayed clock signal DCKi with each other, and then outputs the comparison result to the charge pump circuit 52. For example, the phase comparison circuit 51 outputs an up signal or a down signal in accordance with the difference in phase between the clock signal CK2 and the delayed clock signal DCKi. The charge pump circuit 52 outputs a current pulse based on the comparison result from the phase comparison circuit 51. For example, the charge pump circuit 52 converts the up signal and the down signal into the current pulse. The loop filter 53 smoothes, and at the same time voltage-converts, the current pulses from the charge pump circuit 52, and then outputs the control voltage ACTi.

Figure 8:
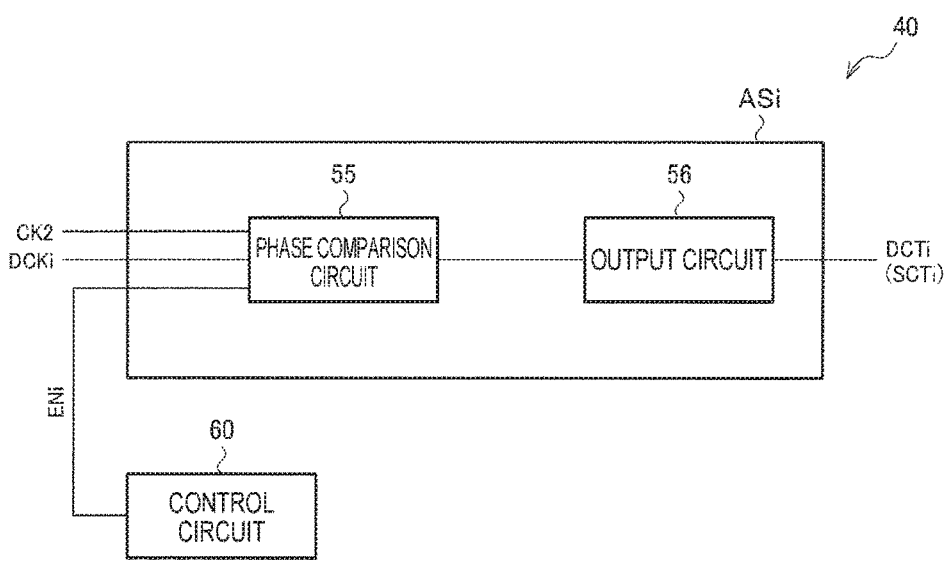
FIG. 8 is a diagram showing a second detailed configuration example of the adjustment circuit.

FIG. 8 shows a second detailed configuration example of the adjustment circuit 40. The adjustment circuit 40 includes the adjustment section ASi and the control circuit 60. The adjustment section ASi includes a phase comparison circuit 55 and an output circuit 56.

In the case in which the enable signal ENi is active, the phase comparison circuit 55 compares the phases of the clock signal CK2 and the delayed clock signal DCKi with each other, and then outputs the comparison result to the output circuit 56. For example, similarly to the phase comparison circuit 51 shown in FIG. 7, the phase comparison circuit 55 outputs the up signal or the down signal in accordance with the phase difference. The output circuit 56 outputs the control data DCTi based on the comparison result from the phase comparison circuit 55. For example, the output circuit 56 increases the value of the control data DCTi in the case in which the up signal is input, and decreases the value of the control data DCTi in the case in which the down signal is input. For example, it is possible to increase or decrease the control data DCTi as much as a predetermined value (e.g., "1"), or the value to be added or subtracted can be varied in accordance with the pulse width of the up signal or the down signal.

4. Method of Time-to-Digital Conversion

A method of time-to-digital conversion using the DLL circuit 30 of the present embodiment will hereinafter be described.

Figure 9:
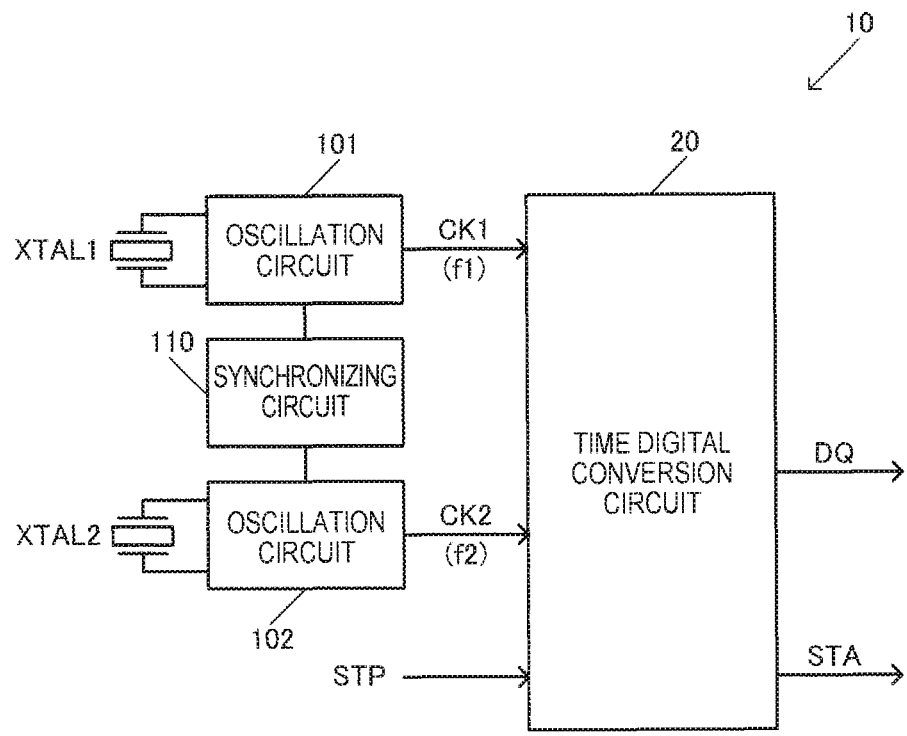
FIG. 9 is a diagram showing a first detailed configuration example of the circuit device.

FIG. 9 shows a first detailed configuration example of the circuit device 10. The circuit device 10 includes a time-to-digital conversion circuit 20, a synchronizing circuit 110, and the oscillation circuits 101, 102. It should be noted that the configuration of the circuit device is not limited to the configuration shown in FIG. 9, but a variety of practical modifications such as elimination of some of the constituents (e.g., the oscillation circuits 101, 102, and the synchronizing circuit 110) or addition of other constituents are possible.

To the time-to-digital conversion circuit 20, there are input clock signals CK1, CK2, and the time-to-digital conversion circuit 20 converts the time into a digital value using the clock signals CK1, CK2. In the example shown in FIG. 9, the time-to-digital conversion circuit 20 converts the time difference in the transition timing between a signal STA (a first signal, e.g., a start signal) and a signal STP (a second signal, e.g., a stop signal) into a digital value DQ using the clock signals CK1, CK2 with the clock frequencies f1, f2. It should be noted that although hereinafter the case of applying the method of the present embodiment to the time-to-digital conversion of converting the time difference in the transition timing between the signals STA, STP (the first and second signals) into the digital value is mainly described, the present embodiment is not limited to this case. For example, it is also possible to apply the method of the present embodiment to the time-to-digital conversion for measuring, for example, absolute time, and so on.

The time difference in the transition timing between the signal STA and the signal STP is the time difference between the edges (e.g., between the rising edges, or between the falling edges) of the signal STA and the signal STB. Further, it is also possible for the time-to-digital conversion circuit 20 to perform a filter process (a digital filter process, a low-pass filter process) of the digital value DQ, and output the digital value DQ on which the filter process has been performed.

The synchronizing circuit 110 performs phase synchronization between the clock signal CK1 and the clock signal CK2. For example, the synchronizing circuit 110 phase-synchronizes the clock signals CK1, CK2 with each other at every phase synchronization timing (every given timing). Specifically, the synchronizing circuit 110 performs the phase synchronization for making the transition timings of the clock signals CK1, CK2 coincide with each other at every phase synchronization timing.

The synchronizing circuit 110 is, for example, a PLL circuit. The PLL circuit includes a phase comparison circuit and a charge pump circuit. Further, the phase comparison circuit performs the phase comparison between a reference clock signal obtained by frequency-dividing the clock frequency f2 of the clock signal CK2 by M, and a clock signal obtained by frequency-dividing the clock frequency f1 of the clock signal CK1 by N. The charge pump circuit outputs a control voltage based on the phase comparison result. The oscillation circuit 101 is, for example, a voltage-controlled crystal oscillator (VCXO), and oscillates the resonator XTAL1 with the oscillation frequency corresponding to the control voltage.

Alternatively, the synchronizing circuit 110 can also be a circuit for electrically connecting the oscillation loop of the oscillation circuit 101 and the oscillation loop of the oscillation circuit 102 to each other at every phase synchronization timing (the timing at which the phases of the oscillation signals roughly coincide with each other) between the oscillation signal in the oscillation circuit 101 and the oscillation signal in the oscillation circuit 102. This circuit includes a counter and a switch circuit. The counter performs a counting operation based on one of the clock signals CK1, CK2. The switch circuit is a switch circuit for connecting the oscillation loop of the oscillation circuit 101 and the oscillation loop of the oscillation circuit 102 to each other. For example, in the case in which the counter counts the clock signal CK1, the synchronizing circuit 110 sets the switch circuit to the ON state every time the count value reaches a given preset value, and performs the phase synchronization.

After the phase synchronization timing between the clock signals CK1, CK2, the time-to-digital conversion circuit 20 makes the transition of the signal level of the signal STA based on the clock signal CK1. For example, the phase synchronization between the clock signals CK1, CK2 by the synchronizing circuit 110 is performed, and after this phase synchronization timing, the time-to-digital conversion circuit 20 makes the transition of the signal level of the signal STA using the clock signal CK1 to generate the signal STA as a pulse signal.

Then, the time-to-digital conversion circuit 20 performs the phase comparison between the signal STP with the signal level making the transition in accordance with the signal STA, and the delayed clock signals DCK1 through DCKn from the DLL circuit 30 to thereby obtain the digital value DQ corresponding to the time difference.

By adopting this process, it becomes possible to realize the high-performance (high-accuracy, high-resolution) time-to-digital conversion while autonomously generating the first signal (STA) used for the time-to-digital conversion. Specifically, since the delay amounts of the delay elements of the DLL circuit 30 are adjusted based on the difference in frequency |f1−f2| between the clock signals CK1, CK2, it is possible to accurately convert the time into the digital value with the resolution Δt corresponding to the frequency difference |f1−f2|.

Further, in the present embodiment, by providing the synchronizing circuit 110 to the circuit device 10, the error caused by the time difference in the transition timing between the clock signals CK1, CK2 at the phase synchronization timing can be minimized. Therefore, it becomes possible to achieve an increase in accuracy and so on by sufficiently reducing the error, which is generated due to the time difference in a systemic manner.

Figure 10:
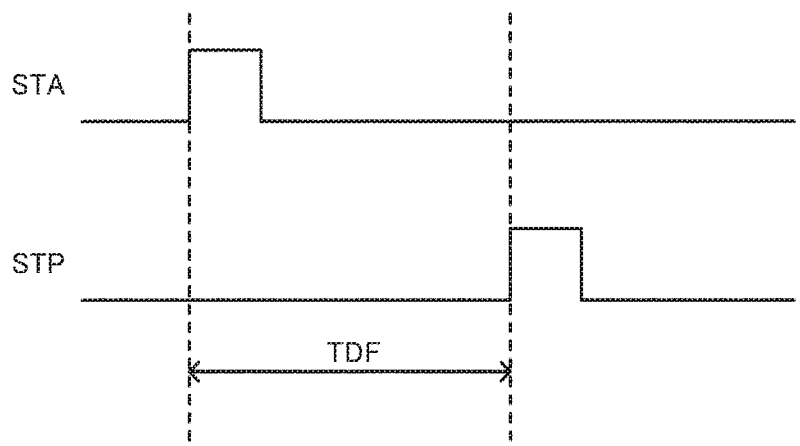
FIG. 10 is a diagram showing a relationship between a first signal and a second signal.

FIG. 10 is a diagram showing a relationship between the signal STA (the first signal, e.g., the start signal) and the signal STP (the second signal, e.g., the stop signal). The time-to-digital conversion circuit 20 of the present embodiment converts the time difference TDF in the transition timing between the signal STA and the signal STP into a digital value. It should be noted that although in FIG. 10, TDF is defined as the time difference between (between the rising edges) the transition timings of the rising edges of the signal STA and the signal STP, but can also be defined as the time difference between (between the falling edges) the transition timings of the falling edges of the signal STA and the signal STP.

Figure 11:
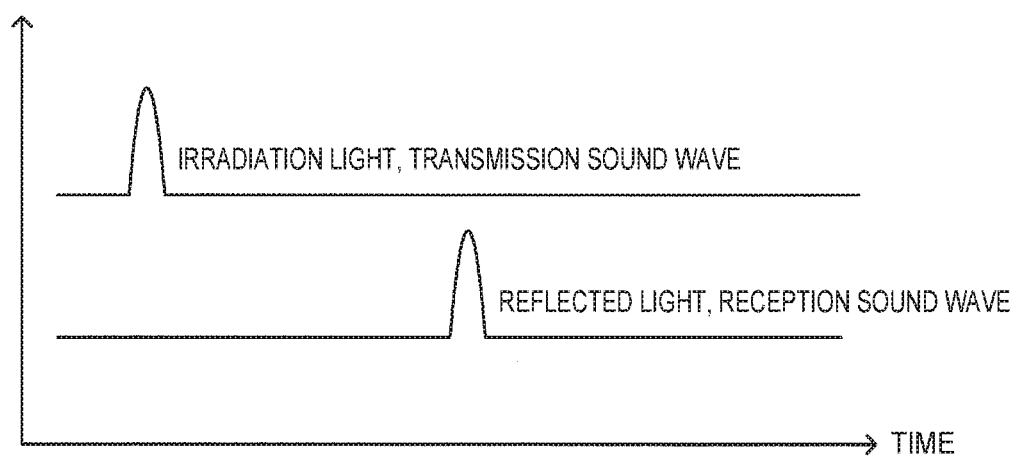
FIG. 11 is a diagram showing an example of physical quantity measurement using the first signal and the second signal.

FIG. 11 is a diagram showing an example of physical quantity measurement using the signals STA, STP. For example, the physical quantity measurement device including the circuit device 10 according to the present embodiment emits the irradiation light (e.g., a laser beam) to an object (e.g., an object in the periphery of a car) using the signal STA. Then, the signal STP is generated due to the reception of the reflected light from the object. For example, the physical quantity measurement device performs waveform shaping on the light reception signal to thereby generate the signal STP. According to this process, by converting the time difference TDF in the transition timing between the signal STA and the signal STP into a digital value, the distance from the object can be measured as a physical quantity using, for example, a time-of-flight (TOF) method, and can be used for, for example, automated driving of a car.

Alternatively, the physical quantity measurement device transmits a transmission sound wave (e.g., an ultrasonic wave) to an object (e.g., a living body) using the signal STA. Then, the signal STP is generated due to the reception of the reception sound wave from the object. For example, the physical quantity measurement device performs waveform shaping on the reception sound wave to thereby generate the signal STP. According to this process, by converting the time difference TDF in the transition timing between the signal STA and the signal STP into a digital value, the distance from the object and so on can be measured, and the measurement of biological information and so on with an ultrasonic wave becomes possible.

It should be noted that in FIG. 10 and FIG. 11, by transmitting the transmission data by the signal STA and using the signal STP due to the reception of the reception data, it is also possible to measure the time from when the transmission data is transmitted to when the reception data is received. Further, the physical quantity measured by the physical quantity measurement device according to the present embodiment is not limited to time and the distance, but a variety of physical quantities such as a flow rate, flow speed, frequency, speed, acceleration, angular velocity, or angular acceleration are conceivable.

Figure 12:
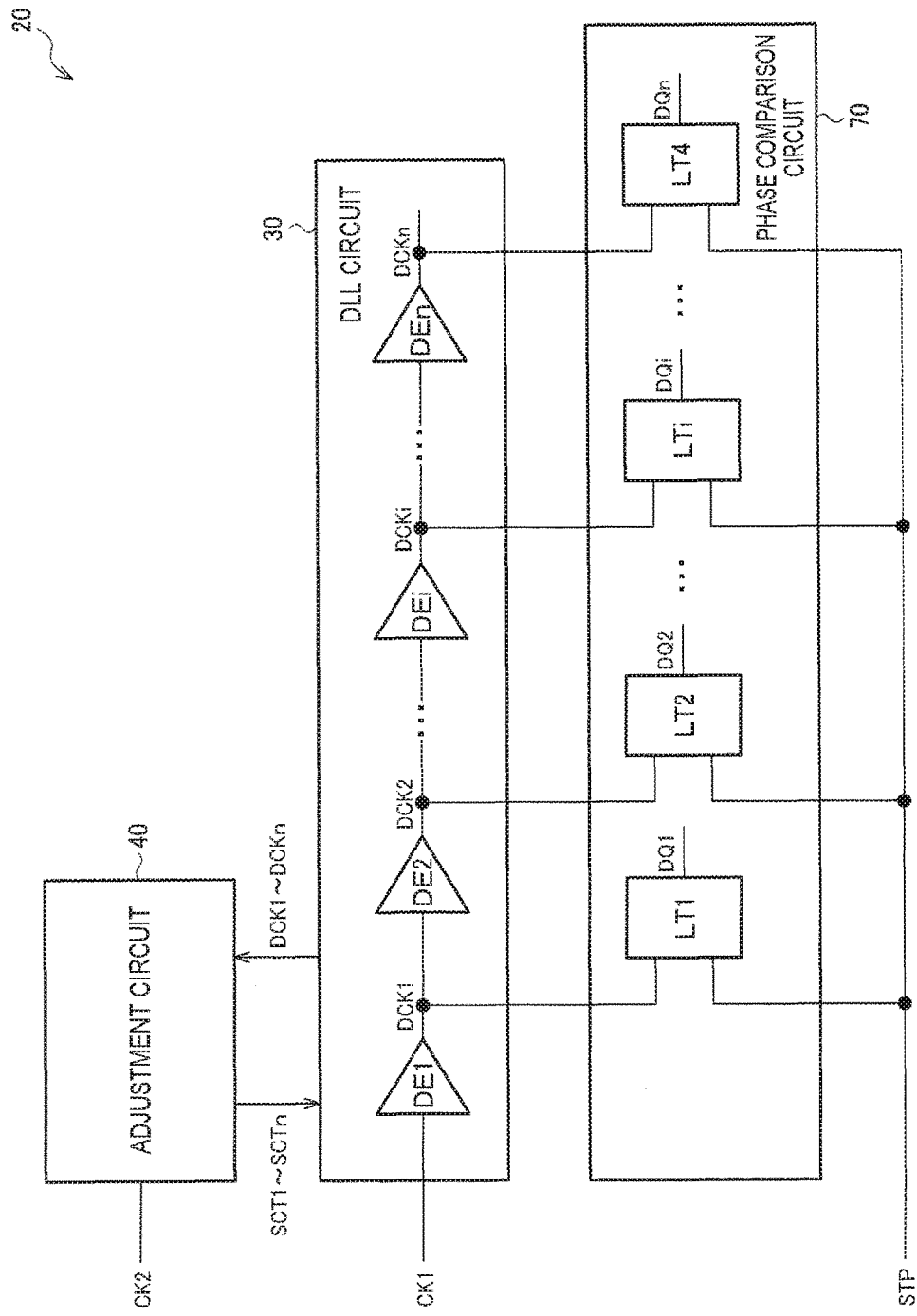
FIG. 12 is a diagram showing a first detailed configuration example of a time-to-digital conversion circuit.

FIG. 12 is a diagram showing a first detailed configuration example of the time-to-digital conversion circuit 20. The time-to-digital conversion circuit 20 shown in FIG. 12 includes the DLL circuit 30, the adjustment circuit 40, and a phase comparison circuit 70. The DLL circuit 30 and the adjustment circuit 40 are the same as the DLL circuit 30 and the adjustment circuit 40 described with reference to FIG. 1.

The phase comparison circuit 70 performs the phase comparison between the signal STP (the second signal, a detection target signal) and the plurality of delayed clock signals (DCK1 through DCKn) obtained by delaying the clock signal CK1 with the DLL circuit 30. Specifically, the phase comparison circuit 70 performs the phase comparison between each of the first through n-th delayed clock signals DCK1 through DCKn and the signal STP, and outputs the time difference in the transition timing between the clock signal CK1 and the signal STP as the digital signals DQ1 through DQn. Since the signal STA (the first signal) is generated at the transition timing of the clock signal CK1, the digital signals DQ1 through DQn represent the time difference in the transition timing between the signal STA and the signal STP.

More specifically, the phase comparison circuit 70 includes phase comparators LT1 through LTn. The phase comparators LT1 through LTn perform the phase comparison between the delayed clock signals DCK1 through DCKn and the signal STP, and then output the comparison results as the digital signals DQ1 through DQn, respectively. The phase comparators LT1 through LTn are each a circuit for determining which one of the transition timings of the two input signals precedes (or follows) the other, and are each, for example, an RS latch. The time-to-digital conversion circuit 20 outputs the digital value DQ based on the digital signals DQ1 through DQn.

Figure 13:
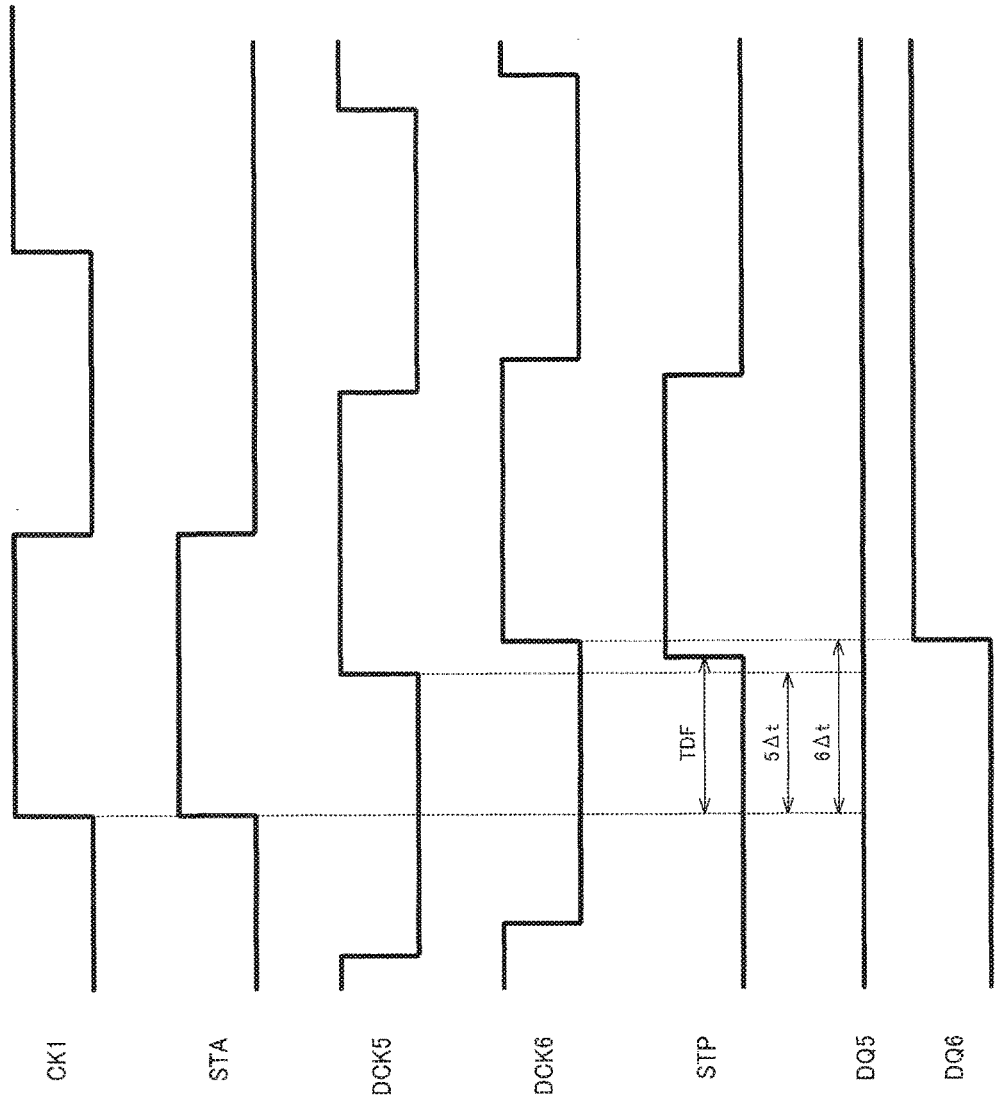
FIG. 13 is a timing chart for explaining an operation of the first detailed configuration example of the time-to-digital conversion circuit.

FIG. 13 is a timing chart for explaining an operation of the first detailed configuration example of the time-to-digital conversion circuit 20.

As shown in FIG. 13, the signal STA rises at the rising edge of the clock signal CK1. The signal STP rises with a delay of the time difference TDF to the signal STA. The delayed clock signals DCK5, DCK6 are clock signals obtained by delaying the clock signal CK1 as much as 5Δt, 6Δt, respectively. In the case in which the time difference TDF exists between 5Δt and 6Δt, the rising edge of the delayed clock signal DCK5 precedes the rising edge of the signal STP, and the rising edge of the delayed clock signal DCK6 follows the rising edge of the signal STP. For example, the phase comparators LT5, LT6 latch the logic levels of the signal STP at the rising edges of the delayed clock signals DCK5, DCK6, respectively. Then, the phase comparator LT5 latches the low level ("0") to output as the digital signal DQ5, and the phase comparator LT6 latches the high level ("1") to output as the digital signal DQ6. In this case, the digital signals DQ1 through DQ5 are set to "0,"

and the digital signals DQ6 through DQn are set to "1." The time-to-digital conversion circuit 20 converts the digital signals DQ1 through DQn into a digital value DQ (e.g., "6" in the case of the decimal number).

As described above, by performing the phase comparison between the delayed clock signals DCK1 through DCKn obtained by delaying the clock signal CK1 with the DLL circuit 30 and the signal STP (the detection target signal), it is possible to measure the time difference (TDF) between the signal STA, the signal level of which makes the transition based on the clock signal CK1, and the signal STP. Since the delay amount in each of the delay elements of the DLL circuit 30 has already been adjusted to Δt by the adjustment circuit 40, the high-performance time-to-digital conversion can be realized.

Figure 14:
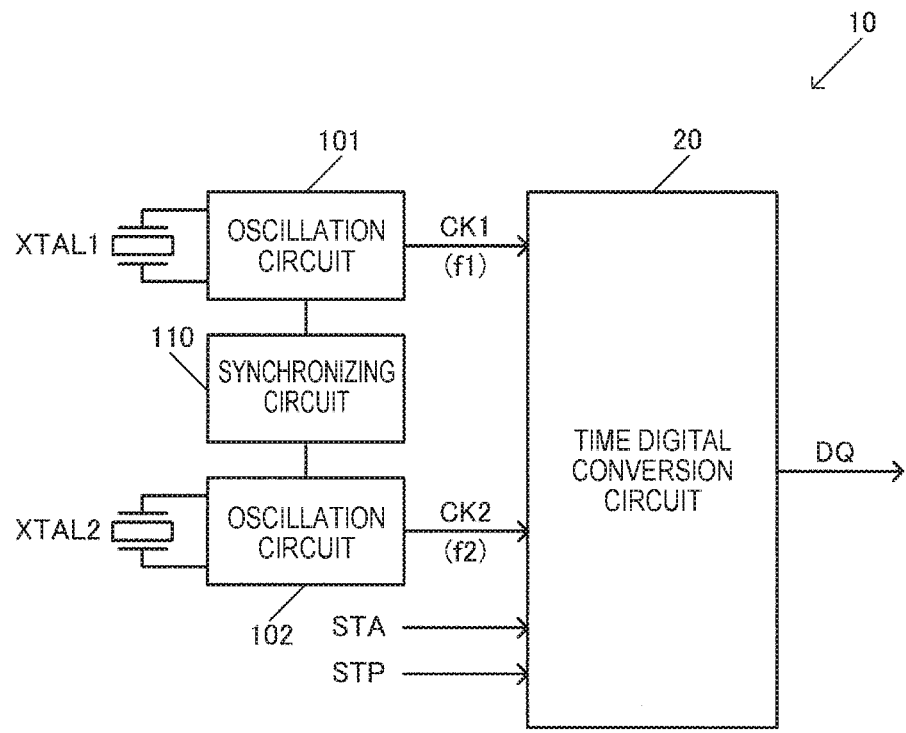
FIG. 14 is a diagram showing a second detailed configuration example of the circuit device.

FIG. 14 shows a second detailed configuration example of the circuit device 10. In FIG. 14, the signal STA is not autonomously generated by the time-to-digital conversion circuit 20, but is input to the time-to-digital conversion circuit 20 from the outside of the time-to-digital conversion circuit 20. It is also possible for the signal STA to be generated inside (e.g., a control circuit not shown) the circuit device 10, or can also be input from the outside (e.g., a processing section such as an electronic apparatus) of the circuit device 10.

Figure 15:
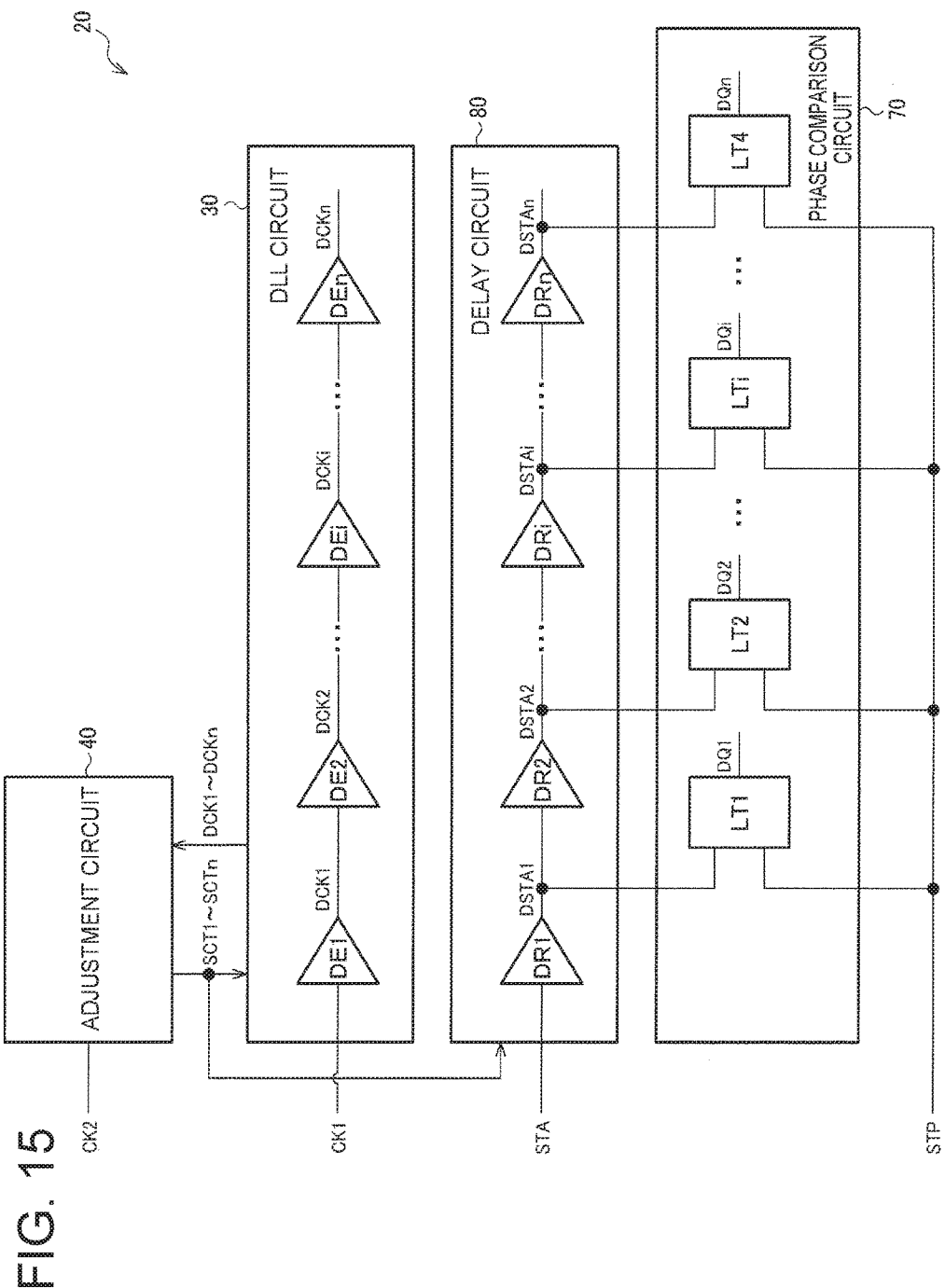
FIG. 15 is a diagram showing a second detailed configuration example of the time-to-digital conversion circuit.

FIG. 15 shows a second detailed configuration example of the time-to-digital conversion circuit 20. The time-to-digital conversion circuit 20 shown in FIG. 15 includes the DLL circuit 30, the adjustment circuit 40, the phase comparison circuit 70, and a delay circuit 80. The DLL circuit 30 and the adjustment circuit 40 are the same as the DLL circuit 30 and the adjustment circuit 40 described with reference to FIG. 1.

The delay circuit 80 is a replica circuit of the DLL circuit 30. The signal STA is input to the delay circuit 80, and the delay circuit 80 delays the signal STA to output a plurality of delayed signals. Specifically, the delay circuit 80 has first through n-th delay elements DR1 through DRn having the same configuration as the delay elements DE1 through DEn of the DLL circuit 30. Further, the control signals SCT1 through SCTn from the adjustment circuit 40 are input to the delay elements DR1 through DRn, and the delay amounts of the delay elements DR1 through DRn are controlled (adjusted) by the control signals SCT1 through SCTn. The signal STA is input to the delay element DR1, and the signal STA is sequentially delayed by the delay elements DR1 through DRn, and thus, the first through n-th delayed signals DSTA1 through DSTAn are output.

The phase comparison circuit 70 performs the phase comparison between the signal STP and the plurality of delayed signals from the delay circuit 80. Specifically, the phase comparators LT1 through LTn of the phase comparison circuit 70 perform the phase comparison between the delayed signals DSTA1 through DSTAn and the signal STP, and then output the comparison results as the digital signals DQ1 through DQn, respectively.

Figure 16:
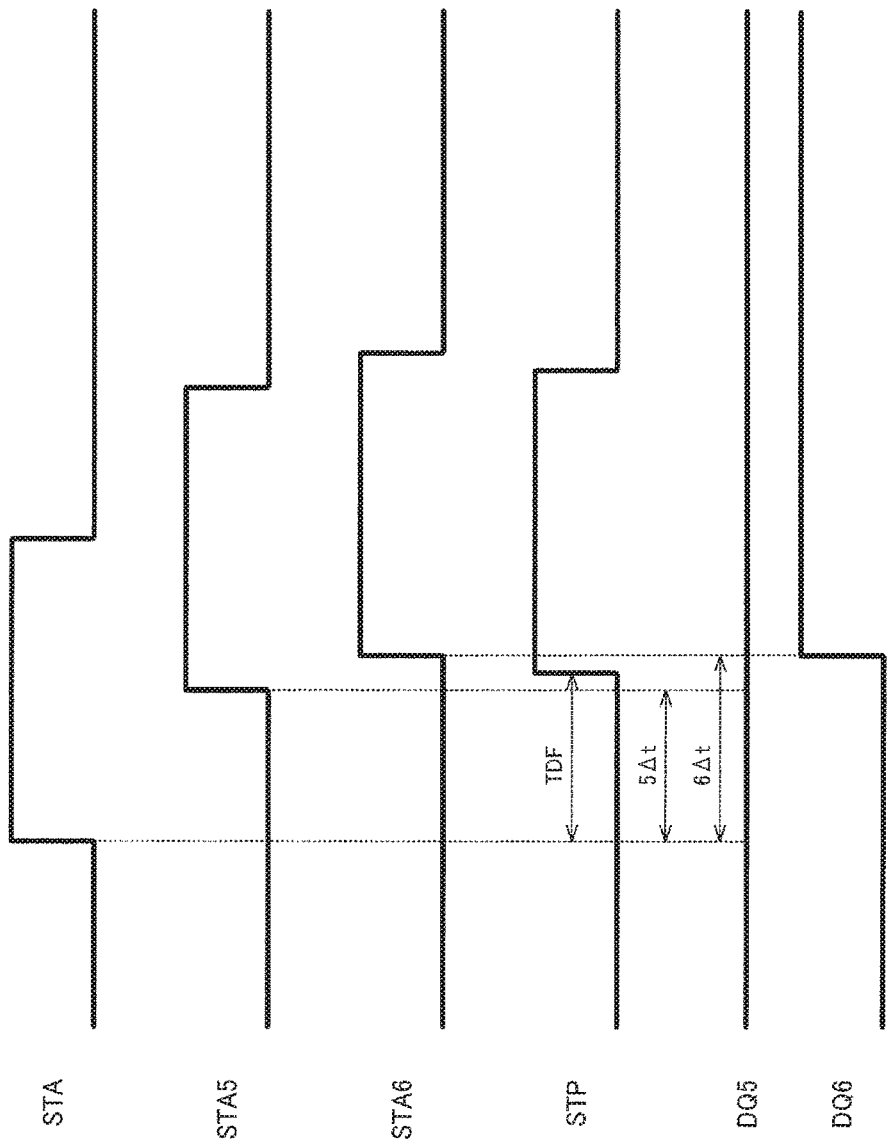
FIG. 16 is a timing chart for explaining an operation of the second detailed configuration example of the time-to-digital conversion circuit.

FIG. 16 is a timing chart for explaining an operation of the second detailed configuration example of the time-to-digital conversion circuit 20.

As shown in FIG. 16, the signal STP rises with a delay of the time difference TDF to the signal STA. The delayed signals DSTA5, DSTA6 from the delay circuit 80, which is the replica circuit of the DLL circuit 30, are the clock signals obtained by delaying the signal STA as much as 5Δt, 6Δt, respectively. In the case in which the time difference TDF exists between 5Δt and 6Δt, the rising edge of the delayed signal DSTA5 precedes the rising edge of the signal STP, and the rising edge of the delayed signal DSTA6 follows the rising edge of the signal STP. In this case, similarly to FIG. 13, the digital signals DQ1 through DQ5 are set to "0," and the digital signals DQ6 through DQn are set to "1."

As described above, by performing the phase comparison between the delayed signals DSTA1 through DSTAn obtained by delaying the signal STA with the delay circuit 80 as the replica circuit of the DLL circuit 30, and the signal STP (the detection target signal), the time difference (TDF) between the signal STA and the signal STP can be measured. The delay amount in each of the delay elements of the DLL circuit 30 is adjusted by the adjustment circuit 40 to Δt, and it results that the delay amount in each of the delay elements of the delay circuit 80 as the replica circuit of the DLL circuit 30 is also adjusted to Δt. Thus, the high-performance time-to-digital conversion can be realized.

Figure 17:
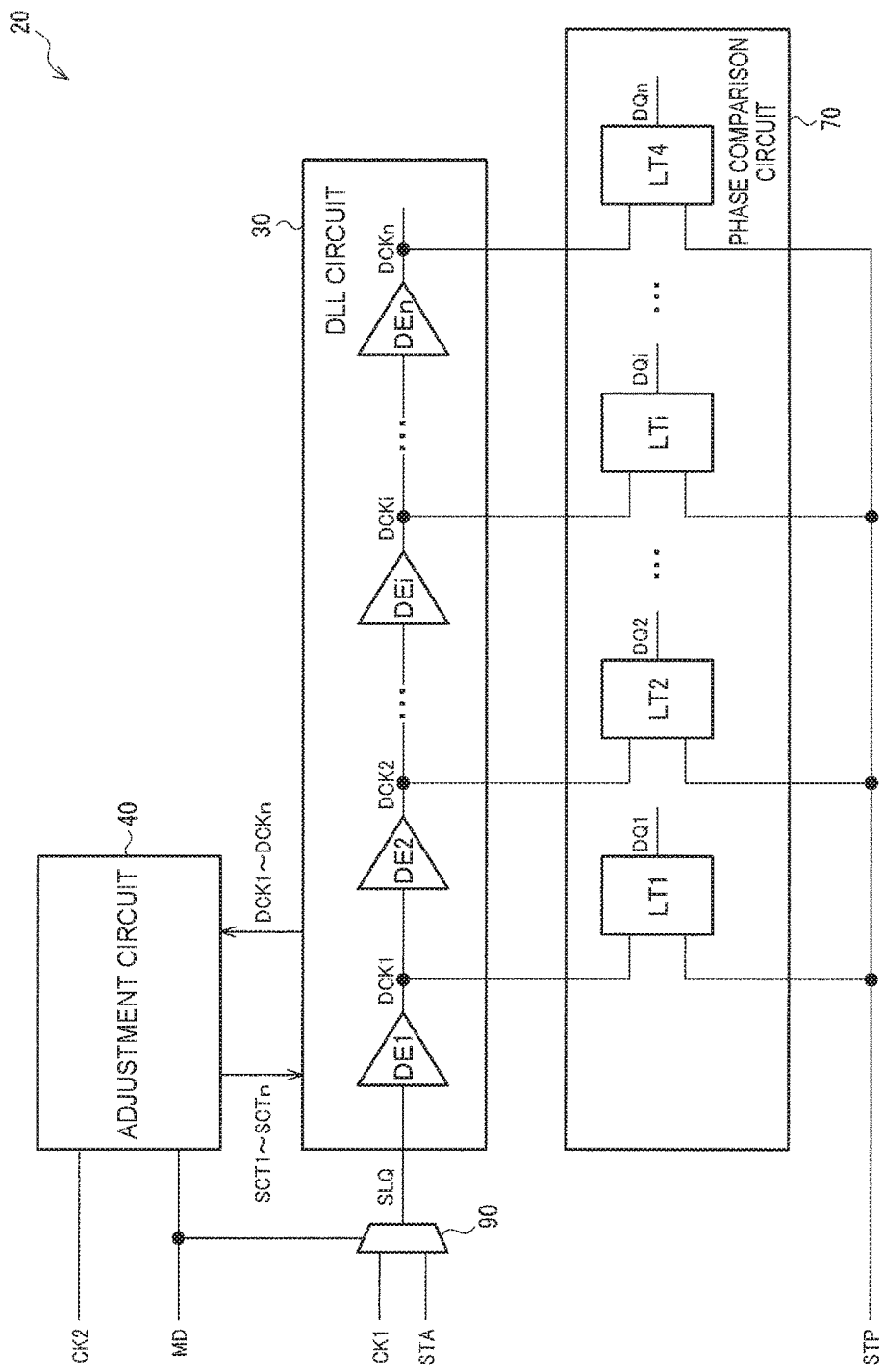
FIG. 17 is a diagram showing a third detailed configuration example of the time-to-digital conversion circuit.

FIG. 17 shows a third detailed configuration example of the time-to-digital conversion circuit 20. The time-to-digital conversion circuit 20 shown in FIG. 17 includes the DLL circuit 30, the adjustment circuit 40, the phase comparison circuit 70, and a selector 90. The DLL circuit 30 and the adjustment circuit 40 are the same as the DLL circuit 30 and the adjustment circuit 40 described with reference to FIG. 1.

The selector 90 inputs either of the clock signal CK1 and the signal STA to the DLL circuit 30. Specifically, the selector 90 selects the clock signal CK1 in a first period, and selects the signal STA in a second period. A signal MD is input to the selector 90 from, for example, a control circuit not shown, and the selector 90 selects either of the clock signal CK1 and the signal STA in accordance with the logic level of the signal MD, and then outputs the signal thus selected to the DLL circuit 30 as a signal SLQ.

The phase comparison circuit 70 performs the phase comparison between the plurality of delayed clock signals from the DLL circuit 30 in the second period and the signal STP. The delayed clock signals DCK1 through DCKn in the second period are first through n-th delayed signals obtained by delaying the signal STA with the delay elements DE1 through DEn. The phase comparators LT1 through LTn of the phase comparison circuit 70 perform the phase comparison between the first through n-th delayed signals and the signal STP, and then output the comparison results as the digital signals DQ1 through DQn, respectively.

Figure 18:
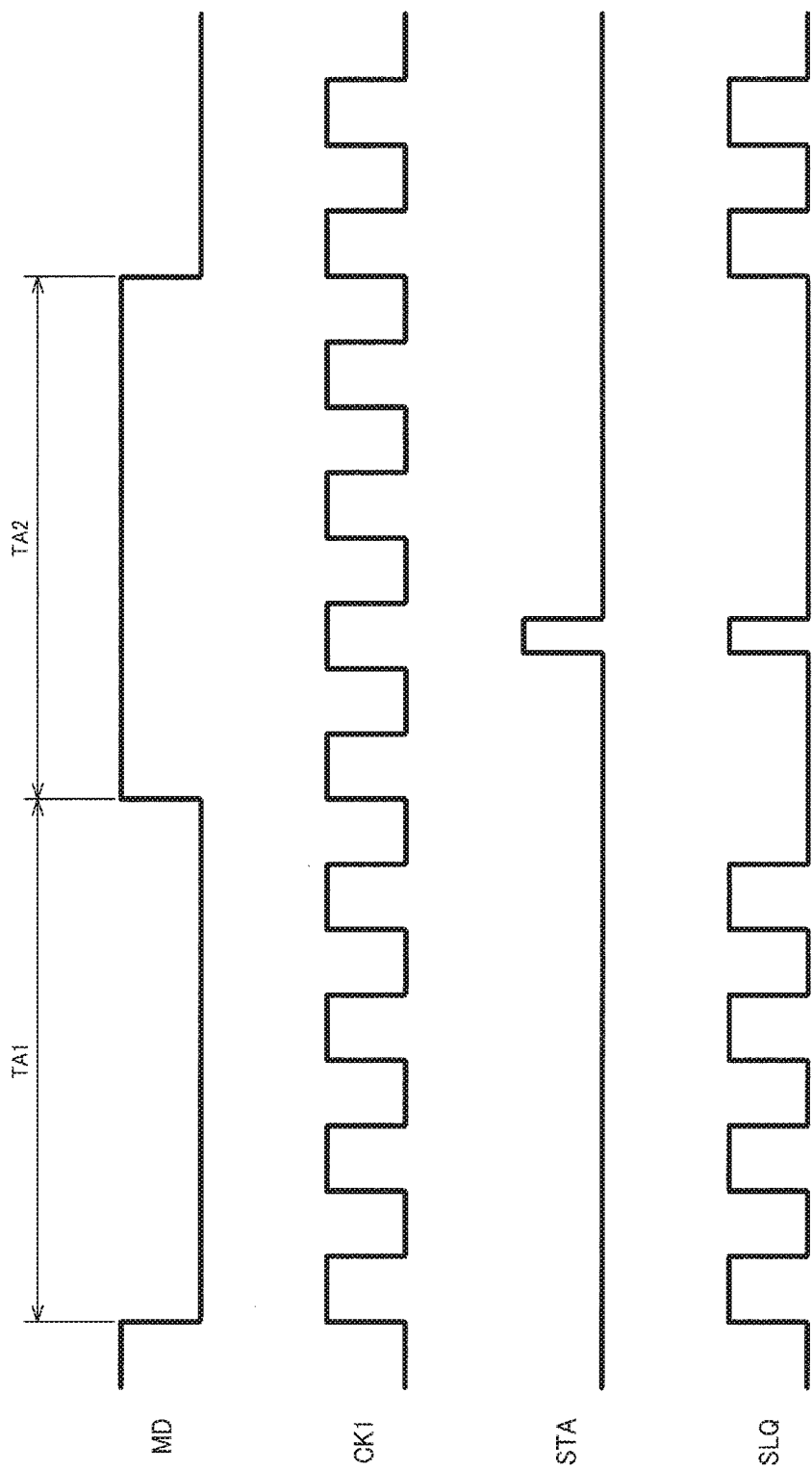
FIG. 18 is a timing chart for explaining an operation of the third detailed configuration example of the time-to-digital conversion circuit.

FIG. 18 is a timing chart for explaining an operation of the third detailed configuration example of the time-to-digital conversion circuit 20.

As shown in FIG. 18, the signal MD is in the first logic level (e.g., the low level) in the first period TA, and is in the second logic level (e.g., the high level) in the second period TB. In the first period TA, the selector 90 outputs the clock signal CK1 as the signal SLQ, and the adjustment circuit 40 adjusts the delay amounts of the delay elements DE1 through DEn based on the delayed clock signals DCK1 through DCKn, and the clock signal CK2. In the second period TB, the selector 90 outputs the signal STA as the signal SLQ, and the phase comparison circuit 70 performs the phase comparison between the delayed clock signals DCK1 through DCKn and the signal STP.

Figure 19:
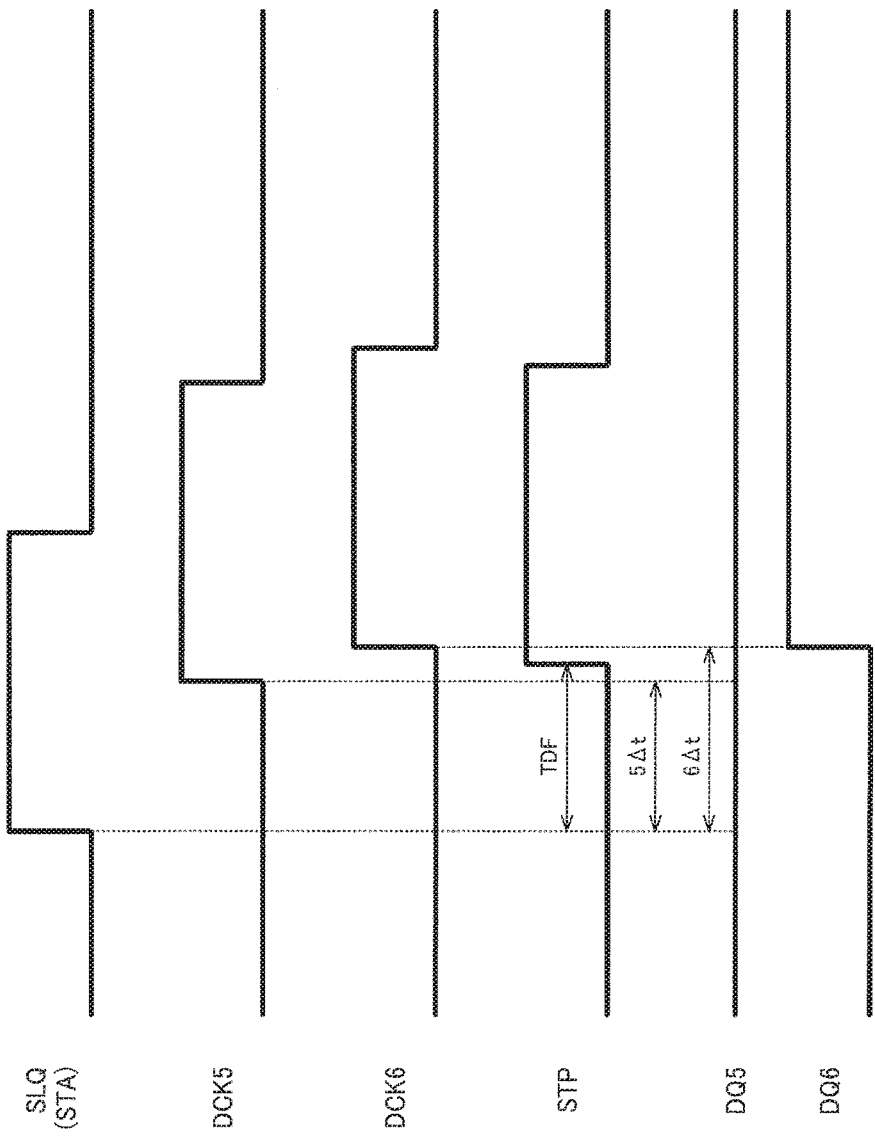
FIG. 19 is a timing chart for explaining an operation of the third detailed configuration example of the time-to-digital conversion circuit in a second period.

FIG. 19 is a timing chart for explaining an operation of the third detailed configuration example of the time-to-digital conversion circuit 20 in the second period.

As shown in FIG. 19, the signal STP rises with a delay of the time difference TDF to the signal SLQ (STA). The delayed clock signals DCK5, DCK6 are the delayed signals obtained by delaying the signal SLQ as much as 5Δt, 6Δt, respectively. In the case in which the time difference TDF exists between 5Δt and 6Δt, the rising edge of the delayed clock signal DCK5 precedes the rising edge of the signal STP, and the rising edge of the delayed clock signal DCK6 follows the rising edge of the signal STP. In this case, similarly to FIG. 13, the digital signals DQ1 through DQ5 are set to "0," and the digital signals DQ6 through DQn are set to "1."

As described above, by performing the phase comparison between the delayed clock signals DCK1 through DCKn obtained by delaying the signal STA with the DLL circuit 30 and the signal STP in the second period, the time difference (TDF) between the signal STA and the signal STP can be measured. Since the DLL circuit 30 is directly adjusted in the delay amount by the adjustment circuit 40 in the first period, it is possible to realize the high-performance time-to-digital conversion compared to the case of using the replica circuit.

It should be noted that although the explanation is hereinabove presented citing the case in which the time-to-digital conversion circuit is of a non-vernier type as an example, the DLL circuit 30 of the present embodiment can also be applied to a vernier type time-to-digital conversion circuit.

For example, an adjustment circuit, a DLL circuit, and a delay circuit similar to the adjustment circuit 40, the DLL circuit 30, and the delay circuit 80 shown in FIG. 15 are further disposed on the signal STP side. Further, the clock signal CK1 is input to the DLL circuit, and a third clock signal CK3 with a third frequency f3 (f1>f3>f2) is input to the adjustment circuit. The delay amount is adjusted to the delay amount $\Delta t'$ corresponding to the difference infrequency |f1−f3| between the clock signals CK1, CK3.

$$\Delta t' = |1/f1 - 1/f3| = |f1 - f3|/(f1 \times f3)$$

The delay circuit as the replica circuit of the DLL circuit is adjusted to have a similar delay amount to that of the DLL circuit, and the delay circuit delays the signal STP to output a plurality of delayed signals. The phase comparison circuit performs the phase comparison between the plurality of delayed signals obtained by delaying the signal STA, and the plurality of delayed signals obtained by delaying the signal STP. The resolution of this time-to-digital conversion is |$\Delta t - \Delta t'$|.

Alternatively, an adjustment circuit, a DLL circuit, and a selector similar to the adjustment circuit 40, the DLL circuit 30, and the selector 90 shown in FIG. 17 can further be disposed on the signal STP side. Similarly to the above, the clock signal CK1 is input to the DLL circuit, the clock signal CK3 is input to the adjustment circuit to adjust the delay amount of the delay elements to $\Delta t'$. The selector 90 selects the clock signal CK1 in the first period, and selects the signal STP in the second period. The phase comparison circuit performs the phase comparison between the plurality of delayed signals obtained by delaying the signal STA, and the plurality of delayed signals obtained by delaying the signal STP in the second period. The resolution of this time-to-digital conversion is |$\Delta t - \Delta t'$|.

5. Physical Quantity Measurement Device, Electronic Apparatus, and Vehicle

Figure 20:
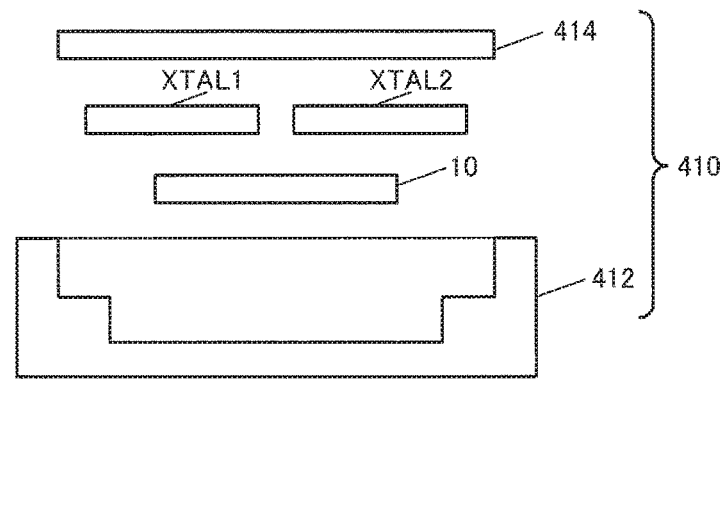
FIG. 20 is a diagram showing a configuration example of a physical quantity measurement device including the circuit device according to the embodiment.

FIG. 20 shows a configuration example of a physical quantity measurement device 400 including the circuit device 10 according to the present embodiment. The physical quantity measurement device 400 includes the circuit device 10 according to the present embodiment, the resonator XTAL1 (a first resonator, a first resonator element) for generating the clock signal CK1, and the resonator XTAL2 (a second resonator, a second resonator element) for generating the clock signal CK2. Further, it is possible for the physical quantity measurement device 400 to include a package 410 for housing the circuit device 10, and the resonators XTAL1, XTAL2.

The package 410 is formed of, for example, a base section 412 and a lid section 414. The base section 412 is a member made of an insulating material such as ceramic, and having, for example, a box-like shape, and the lid section 414 is a member to be bonded to the base section 412, and having, for example, a plate-like shape. On the bottom surface, for example, of the base section 412, there are disposed external connection terminals (external electrodes) to be connected to external equipment. In an internal space (a cavity) formed by the base section 412 and the lid section 414, there are housed the circuit device 10 and the resonators XTAL1, XTAL2. Further, by sealing the internal space with the lid section 414, the circuit device 10 and the resonators XTAL1, XTAL2 are airtightly encapsulated in the package 410.

The circuit device 10 and the resonators XTAL1, XTAL2 are installed in the package 410. Further, terminals of the resonators XTAL1, XTAL2 and terminals (pads) of the circuit device 10 (IC) are electrically connected respectively to each other with interconnections of the package 410. The circuit device 10 is provided with the oscillation circuits 101, 102 for oscillating the resonators XTAL1, XTAL2, and by oscillating the resonators XTAL1, XTAL2 using these oscillation circuits 101, 102, the clock signals CK1, CK2 are generated.

For example, as a comparative example, there is considered the case in which the first and second oscillation circuits are provided respectively to the first and second quartz crystal resonators, and the circuit device does not incorporate the first and second oscillation circuits. In this case, it is not possible to realize the phase synchronization of the first and second clock signals due to the synchronizing circuit 110. Further, there is a disadvantage that it is not possible to perform the control process common to the first and second oscillation circuits in the circuit device.

It should be noted that a variety of practical modifications can be made as the configuration of the physical quantity measurement device 400. It is also possible for, for example, the base section 412 to have a plate-like shape, and for the lid section 414 to have a shape provided with a recess formed inside the lid section 414. Further, a variety of practical modifications can be made on the installation configuration, the wiring connection, and so on of the circuit device 10 and the resonators XTAL1, XTAL2 in the package 410. Further, the resonators XTAL1, XTAL2 are not required to be configured as completely separated parts, but can also be first and second oscillation areas provided to a single member. Further, it is also possible to provide the physical quantity measurement device 400 (the package 410) with three or more resonators. In this case, it is sufficient to provide three or more oscillation circuits corresponding to the resonators to the circuit device 10.

Figure 21:
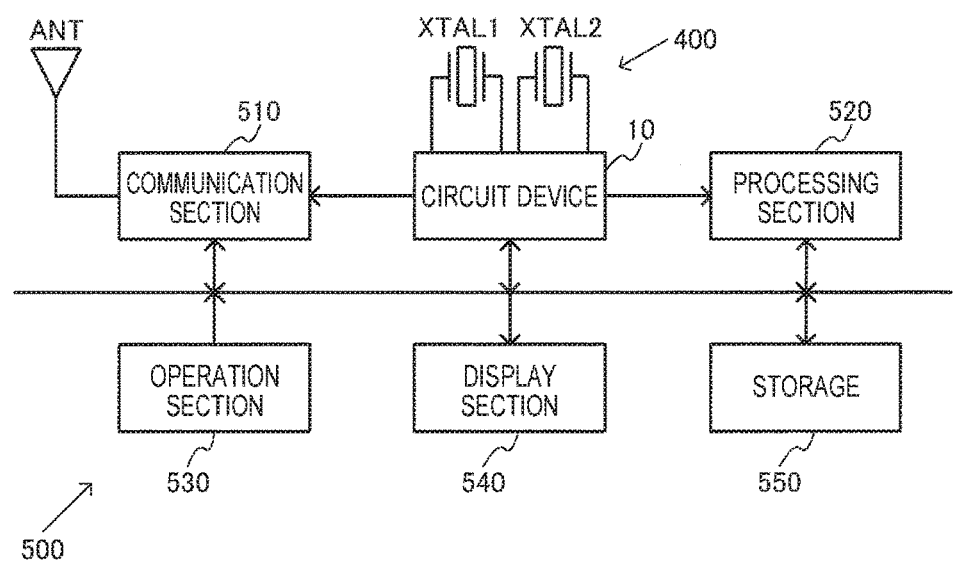
FIG. 21 is a diagram showing a configuration example of an electronic apparatus including the circuit device according to the embodiment.

FIG. 21 shows a configuration example of an electronic apparatus 500 including the circuit device 10 according to the present embodiment. The electronic apparatus 500 includes the circuit device 10 according to the present embodiment, the resonators XTAL1, XTAL2, and a processing section 520. Further, the electronic apparatus 500 can include a communication section 510, an operation section 530, a display section 540, a storage 550, and an antenna ANT. The circuit device 10 and the resonators XTAL1, XTAL2 constitute the physical quantity measurement device 400. It should be noted that the configuration of the electronic apparatus 500 is not limited to the configuration shown in FIG. 21, but it is possible to adopt a variety of practical modifications such as elimination of some of the constituents or addition of other constituents.

As the electronic apparatus 500, there can be assumed a variety of apparatuses such as a measurement instrument for measuring a physical quantity such as a distance, time, flow speed, or a flow rate, a biological information measurement apparatus for measuring biological information (e.g., an ultrasonic measurement device, a sphygmograph, and a blood-pressure measurement device), an in-car apparatus (e.g., equipment for automated driving), a network-related apparatus such as a base station, or a router, a wearable apparatus such as a head-mounted display device, or a timepiece related apparatus, a printer, a projection apparatus, a robot, a portable information terminal (e.g., a smartphone, a cellular phone, a portable video game player, a laptop PC, or a tablet PC), a content supply terminal for delivering contents, a video apparatus such as a digital camera or a video camera.

The communication section 510 (a wireless circuit) performs a process of receiving data externally via the antenna ANT and transmitting data to the outside. The processing section 520 performs a control process of the electronic apparatus 500, a variety of types of digital processing of the data transmitted or received via the communication section 510. Further, the processing section 520 performs a variety of processes using the physical quantity information measured by the physical quantity measurement device 400. The function of the processing section 520 can be realized by a processor such as a microcomputer.

The operation section 530 is for allowing the user to perform an input operation, and can be realized by operation buttons, a touch panel display, and so on. The display section 540 is for displaying a variety of types of information, and can be realized by a display using a liquid crystal, an organic EL, and so on. It should be noted that in the case of using the touch panel display as the operation section 530, it results that the touch panel display also functions as the operation section 530 and the display section 540. The storage 550 is for storing the data, and the function thereof can be realized by a semiconductor memory such as a RAM or a ROM, a hard disk drive (HDD), or the like.

Figure 22:
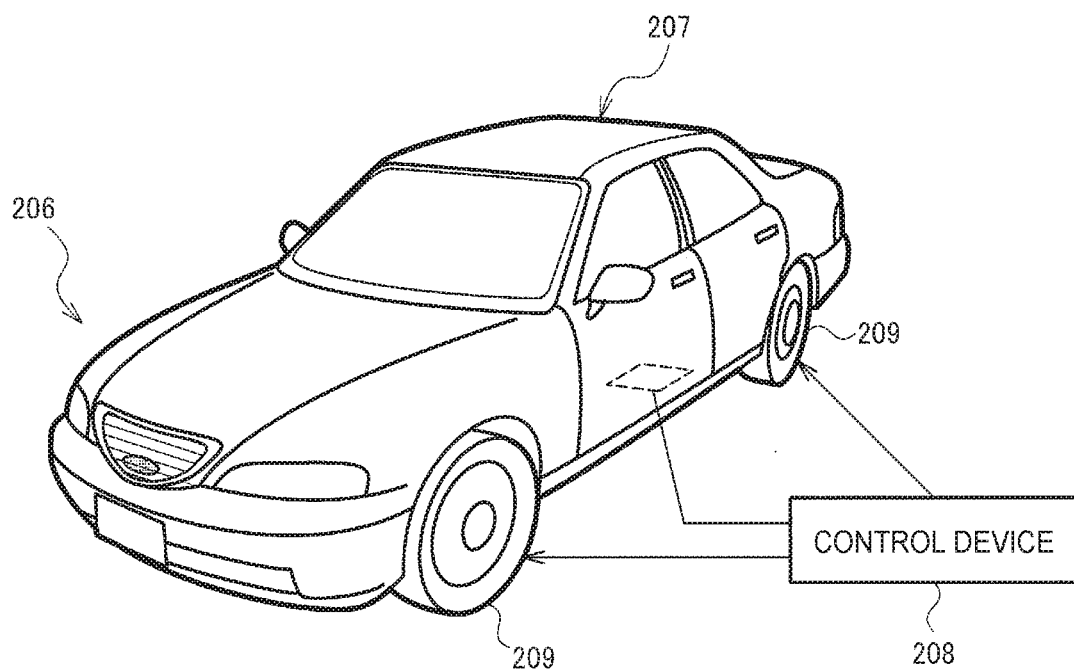
FIG. 22 is a diagram showing an example of a vehicle including the circuit device according to the embodiment.

FIG. 22 shows an example of a vehicle including the circuit device according to the present embodiment. The circuit device according to the present embodiment can be incorporated in a variety of vehicles such as a car, an airplane, a motorbike, a bicycle, a robot, a ship, and a boat. The vehicle is equipment or an apparatus, which is provided with a drive mechanism such as an engine or an electric motor, a steering mechanism such as a steering wheel or a helm, and a variety of electronic apparatuses (in-car equipment), and moves on the ground, in the air, or on the sea. FIG. 22 schematically shows a car 206 as a specific example of the vehicle. The car 206 (the vehicle) incorporates a physical quantity measurement device (not shown) having the circuit device according to the present embodiment and an resonator. A control device 208 performs a variety of control processes based on the physical quantity information measured by the physical quantity measurement device. For example, in the case in which the distance information of an object located in the periphery of the car 206 is measured as the physical quantity information, the control device 208 performs a variety of control processes for the automated driving using the distance information thus measured. The control device 208 controls the stiffness of the suspension, and controls the brake of each of wheels 209 in accordance with, for example, the attitude of a vehicle body 207. It should be noted that the apparatus incorporating the circuit device or the physical quantity measurement device according to the present embodiment is not limited to such a control device 208, but the circuit device or the physical quantity measurement device according to the present embodiment can be incorporated in a variety of apparatuses (in-car equipment) provided to a vehicle such as the car 206.

It should be noted that although the present embodiment is hereinabove explained in detail, it should easily be understood by those skilled in the art that it is possible to make a variety of modifications not substantially departing from the novel matters and the advantage of the invention. Therefore, all of such modified examples should be included in the scope of the invention. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the invention. Further, the configurations and the operations of the circuit device, the physical quantity measurement device, the electronic apparatus, and the vehicle are not limited to those explained in the present embodiment, but can be implemented with a variety of modifications.

The entire disclosure of Japanese Patent Application No. 2016-187862, filed Sep. 27, 2016 is expressly incorporated by reference herein.

What is claimed is:

1. A circuit device comprising:
   a delay locked loop (DLL) circuit, which has a plurality of delay elements, and to which a first clock signal generated using a first resonator and having a first clock frequency is input; and
   an adjustment circuit, to which delayed clock signals from the delay elements of the DLL circuit, and a second clock signal generated using a second resonator and having a second clock frequency lower than the first clock frequency are input, and which adjusts delay amounts of the delay elements of the DLL circuit using a frequency difference between the first clock frequency and the second clock frequency.

2. The circuit device according to claim 1, wherein the adjustment circuit adjusts the delay amounts of the plurality of delay elements of the DLL circuit using a time difference in transition timing between the first clock signal and the second clock signal.

3. The circuit device according to claim 1, wherein the adjustment circuit adjusts the delay amount of the i-th (i is an integer no smaller than 1) delay element of the plurality of delay elements using a transition of a signal level at i-th transition timing of the second clock signal after phase synchronization timing between the first clock signal and the second clock signal.

4. The circuit device according to claim 3, wherein the adjustment circuit adjusts the delay amount of the j-th (j is an integer greater than i) delay element of the plurality of delay elements using a transition of the signal level at j-th transition timing after the i-th transition timing of the second clock signal.

5. The circuit device according to claim 1, wherein in a case of defining a time difference corresponding to the frequency difference as $\Delta t$, the adjustment circuit adjusts the delay amount due to the first through k-th (k is an integer no smaller than 1) delay elements of the plurality of delay elements to a delay amount corresponding to $k \times \Delta t$.

6. The circuit device according to claim 1, wherein
the first clock signal is input to the DLL circuit, and the DLL circuit outputs a plurality of delay clock signals generated by delaying the first clock signal with the plurality of delay elements, and
the adjustment circuit performs phase comparison between the delayed clock signals and the second clock signal, and adjusts the delay amounts of the delay elements of the DLL circuit based on a result of the phase comparison.

7. The circuit device according to claim 1, wherein
in a case of assuming the number of the delay elements of the DLL circuit as n (n is an integer no smaller than 3), the adjustment circuit adjusts the delay amounts of m (m is an integer no smaller than 1 and no greater than n) delay elements.

8. The circuit device according to claim 1, wherein
the adjustment circuit adjusts at least one of a capacitance value of a variable capacitor provided corresponding to the delay element, and a current value of a variable current source provided corresponding to the delay element.

9. The circuit device according to claim 1, further comprising:
a phase comparison circuit,
wherein a first signal is generated based on the first clock signal, and
the phase comparison circuit performs phase comparison between the second signal and the plurality of delayed clock signals obtained by delaying the first clock with the DLL circuit.

10. The circuit device according to claim 1, further comprising:
a delay circuit as a replica circuit of the DLL circuit; and
a phase comparison circuit,
wherein the first signal is input to the delay circuit, and the delay circuit delays the first signal to output a plurality of delayed signals, and
the phase comparison circuit performs phase comparison between the second signal and the plurality of delayed signals from the delay circuit.

11. The circuit device according to claim 1, further comprising:
a selector adapted to input either of the first clock signal and the first signal to the DLL circuit; and
a phase comparison circuit,
wherein, the selector selects the first clock signal in a first period, and selects the first signal in a second period, and
the phase comparison circuit performs phase comparison between the plurality of delayed clock signals from the DLL circuit in the second period and the second signal.

12. A physical quantity measurement device comprising:
the circuit device according to claim 1;
the first resonator adapted to generate the first clock signal; and
the second resonator adapted to generate the second clock signal.

13. A physical quantity measurement device comprising:
the circuit device according to claim 2;
the first resonator adapted to generate the first clock signal; and
the second resonator adapted to generate the second clock signal.

14. A physical quantity measurement device comprising:
the circuit device according to claim 3;
the first resonator adapted to generate the first clock signal; and
the second resonator adapted to generate the second clock signal.

15. An electronic apparatus comprising:
the circuit device according to claim 1.

16. An electronic apparatus comprising:
the circuit device according to claim 2.

17. An electronic apparatus comprising:
the circuit device according to claim 3.

18. A vehicle comprising:
the circuit device according to claim 1.

19. A vehicle comprising:
the circuit device according to claim 2.

20. A vehicle comprising:
the circuit device according to claim 3.

* * * * *